: US 11,749,327 B2
(45) Date of Patent: Sep. 5, 2023

(12) United States Patent
Shaik et al.

(54) MEMORY BIT CELL CIRCUIT INCLUDING A BIT LINE COUPLED TO A STATIC RANDOM-ACCESS MEMORY (SRAM) BIT CELL CIRCUIT AND A NON-VOLATILE MEMORY (NVM) BIT CELL CIRCUIT AND A MEMORY BIT CELL ARRAY CIRCUIT

(71) Applicant: QUALCOMM Incorporated, San Diego, CA (US)

(72) Inventors: Khaja Ahmad Shaik, Douglas (IE); Bharani Chava, Cork City (IE)

(73) Assignee: QUALCOMM Incorporated, San Diego, CA (US)

( * ) Notice: Subject to any disclaimer, the term of this patent is extended or adjusted under 35 U.S.C. 154(b) by 96 days.

(21) Appl. No.: 17/459,186

(22) Filed: Aug. 27, 2021

(65) Prior Publication Data

US 2022/0180910 A1 Jun. 9, 2022

Related U.S. Application Data

(60) Provisional application No. 63/123,144, filed on Dec. 9, 2020.

(51) Int. Cl.
*G11C 11/00* (2006.01)
*G11C 11/419* (2006.01)
*G11C 11/16* (2006.01)

(52) U.S. Cl.
CPC ........ *G11C 11/005* (2013.01); *G11C 11/1673* (2013.01); *G11C 11/1675* (2013.01); *G11C 11/419* (2013.01)

(58) Field of Classification Search
CPC . G11C 11/005; G11C 11/419; G11C 11/1673; G11C 11/1675

USPC ......................................................... 365/154
See application file for complete search history.

(56) References Cited

U.S. PATENT DOCUMENTS

| 10,672,465 B1* | 6/2020 | Agrawal ................ G06N 3/065 |
| 2011/0280073 A1 | 11/2011 | Chiu et al. |
| 2012/0020159 A1* | 1/2012 | Ong ................... G11C 14/0081 365/185.08 |
| 2015/0318024 A1* | 11/2015 | Baker, Jr. ........... G11C 14/0081 365/72 |
| 2020/0126619 A1* | 4/2020 | Jaiswal .................. G11C 5/147 |

* cited by examiner

OTHER PUBLICATIONS

International Search Report and Written Opinion for International Patent Application No. PCT/US2021/052851, dated Jan. 20, 2022, 16 pages.

*Primary Examiner* — Sung Il Cho
(74) *Attorney, Agent, or Firm* — Withrow & Terranova, PLLC

(57) ABSTRACT

An exemplary memory bit cell circuit, including a bit line coupled to an SRAM bit cell circuit and an NVM bit cell circuit, with reduced area and reduced power consumption, included in a memory bit cell array circuit, is disclosed. The SRAM bit cell circuit includes cross-coupled true and complement inverters and a first access circuit coupled to the bit line. The NVM bit cell circuit includes an NVM device coupled to the bit line by a second access circuit and is coupled to the SRAM bit cell circuit. Data stored in the SRAM bit cell circuit and the NVM bit cell circuit are accessed based on voltages on the bit line. A true SRAM data is determined by an SRAM read voltage on the bit line, and an NVM data in the NVM bit cell circuit is determined by a first NVM read voltage on the bit line.

21 Claims, 8 Drawing Sheets

MEMORY BIT CELL CIRCUIT INCLUDING A BIT LINE COUPLED TO A STATIC RANDOM-ACCESS MEMORY (SRAM) BIT CELL CIRCUIT AND A NON-VOLATILE MEMORY (NVM) BIT CELL CIRCUIT AND A MEMORY BIT CELL ARRAY CIRCUIT

PRIORITY APPLICATION

The present application claims priority under 35 U.S.C. § 119(e) to U.S. Provisional Patent Application Ser. No. 63/123,144, filed Dec. 9, 2020, and entitled "MEMORY BIT CELL CIRCUIT INCLUDING A BIT LINE COUPLED TO A STATIC RANDOM-ACCESS MEMORY (SRAM) BIT CELL CIRCUIT AND A NON-VOLATILE MEMORY (NVM) BIT CELL CIRCUIT AND A MEMORY BIT CELL ARRAY CIRCUIT," which is incorporated herein by reference in its entirety.

BACKGROUND

I. Field of the Disclosure

The field of the disclosure relates generally to memory circuits for storing data in a mobile electronic device.

II. Background

Integrated circuits (ICs) in mobile devices, such as hand-held smartphones, execute a wide variety of software applications. Audio and video applications require large amounts of data to be processed by one or more processors in the ICs. The data must be read from and written to memory at a high rate of speed and with very low latency to achieve performance expectations of application users. Each time data is accessed, memory circuits that perform the read and write operations, and the circuits that actually store the data, utilize energy from the device's battery. Therefore, a memory cell circuit suited for use in a smartphone occupies minimal area of a memory chip and is capable of high-speed and low-power operation. High-speed memory cells typically utilize energy to maintain a stored data value, thereby depleting a battery even when the phone is not being used. Memory cells that can maintain a stored data value in the absence of power (i.e., non-volatile memory) may have a limited lifespan, rendering the memory cells unable to store data after a threshold number of write operations. Conventional memory cells that incorporate both a high-speed access capability and an ability to maintain a stored data value in the absence of power occupy a large area of a memory chip.

SUMMARY OF THE DISCLOSURE

Aspects disclosed herein include a memory bit cell circuit including a bit line coupled to a static random-access memory (SRAM) bit cell circuit and a non-volatile memory (NVM) bit cell circuit. Methods of accessing data in memory bit cell circuits of the memory bit cell array circuit are also disclosed. A memory bit cell circuit includes an SRAM bit cell circuit for low access latency and long-term reliability and also includes an NVM bit cell circuit for storing data without supplied power. A conventional array of memory bit cell circuits including SRAM and NVM bit cell circuits and a plurality of access lines (e.g., word lines and/or bit lines) for accessing data stored in both circuits occupy a large area of a die. An exemplary memory bit cell circuit, including a bit line coupled to an SRAM bit cell circuit and an NVM bit cell circuit, each with reduced transistor count for reduced area and reduced power consumption, is included in a memory bit cell array circuit. The SRAM bit cell circuit includes cross-coupled true and complement inverters and a first access circuit coupled to the bit line. The NVM bit cell circuit includes an NVM device coupled to the bit line by a second access circuit and is coupled to the SRAM bit cell circuit. Data stored in the SRAM bit cell circuit and the NVM bit cell circuit are accessed based on voltages on the bit line. In an example, a true SRAM data is determined by an SRAM read voltage on the bit line, and an NVM data in the NVM bit cell circuit is determined by a first NVM read voltage on the bit line.

In an exemplary aspect, a memory bit cell circuit including a bit line, an SRAM bit cell circuit, and an NVM bit cell circuit is disclosed. The SRAM bit cell circuit includes a storage circuit comprising a true inverter circuit and a complement inverter circuit. The true inverter circuit comprises a true input node, a true output node comprising a true storage node, a true power node coupled to a supply voltage rail, and a true ground node coupled to a ground voltage rail. The complement inverter circuit comprises a complement input node coupled to the true output node of the true inverter circuit, a complement output node comprising a complement storage node coupled to the true input node of the true inverter circuit, a complement power node coupled to a high voltage rail and a complement ground node coupled to a low voltage rail. The storage circuit also includes a first access circuit coupled to the true output node and the bit line. The NVM bit cell circuit includes an NVM device coupled between the complement output node and a first node, and a second access circuit coupled to the first node and the bit line.

In another exemplary aspect, a memory bit cell array circuit comprising a first bit line, a first plurality of memory bit cell circuits, and an array access circuit is disclosed. The first plurality of memory bit cell circuits are each coupled to the first bit line, and each memory bit cell circuit comprises an SRAM bit cell circuit configured to, in response to receiving a supply voltage, store a true SRAM data on a true storage node and store a. complement SRAM data on a complement storage node, the SRAM bit cell circuit comprising a first access circuit coupled to the true storage node and the first bit line. Each memory bit cell circuit also comprises an NVM bit cell circuit configured to store an NVM data, the NVM bit cell circuit comprising an NVM device coupled to the complement storage node of the SRAM bit cell circuit and a first node, and a second access circuit coupled to the first node and the first bit line. The memory bit cell array circuit also comprises an array access circuit coupled to the first bit line, and the array access circuit is configured to determine the true SRAM data stored in the SRAM bit cell circuit of a memory bit cell circuit of the first plurality of memory bit cell circuits based on a first SRAM read voltage on the first bit line, and determine a first NVM data stored in the NVM bit cell circuit of the memory bit cell circuit of the first plurality of memory bit cell circuits based on a first NVM read voltage on the first bit line.

In another exemplary aspect, a method of accessing stored data in a memory bit cell circuit in a memory bit cell array circuit is disclosed. The method includes accessing, by an array access circuit, one of a true SRAM data in an SRAM bit cell circuit and an NVM data in an NVM bit cell circuit based on a voltage on a first bit line.

In another exemplary aspect, a method of operating a memory bit cell array circuit is disclosed. The method comprising, in response to activating a supply voltage in an SRAM bit cell circuit, driving a first current through an NVM bit cell circuit of each memory bit cell circuit in a first plurality of memory bit cell circuits to set the NVM bit cell circuit to a first resistance state. The method further comprises, in response to an indication of deactivation of the supply voltage, for each memory bit cell circuit of the first plurality of memory bit cell circuits, reading a true SRAM data on a true storage node of the SRAM bit cell circuit, in response to determining the true SRAM data in the SRAM bit cell circuit corresponds to a second resistance state of the NVM bit cell circuit, driving a second current through the NVM bit cell circuit to set the NVM bit cell circuit to the second resistance state, and in response to determining the true SRAM data in the SRAM bit cell circuit corresponds to the first resistance state of the NVM bit cell circuit, leaving the NVM bit cell circuit in the first resistance state, wherein in the first plurality of memory bit cell circuits, each memory bit cell circuit comprises the SRAM bit cell circuit configured to, in response to receiving the supply voltage, store the true SRAM data on the true storage node and store a complement SRAM data on a complement storage node, and the NVM bit cell circuit configured to store an NVM data independent of the SRAM bit cell circuit receiving the supply voltage.

DETAILED DESCRIPTION

Figure 1:
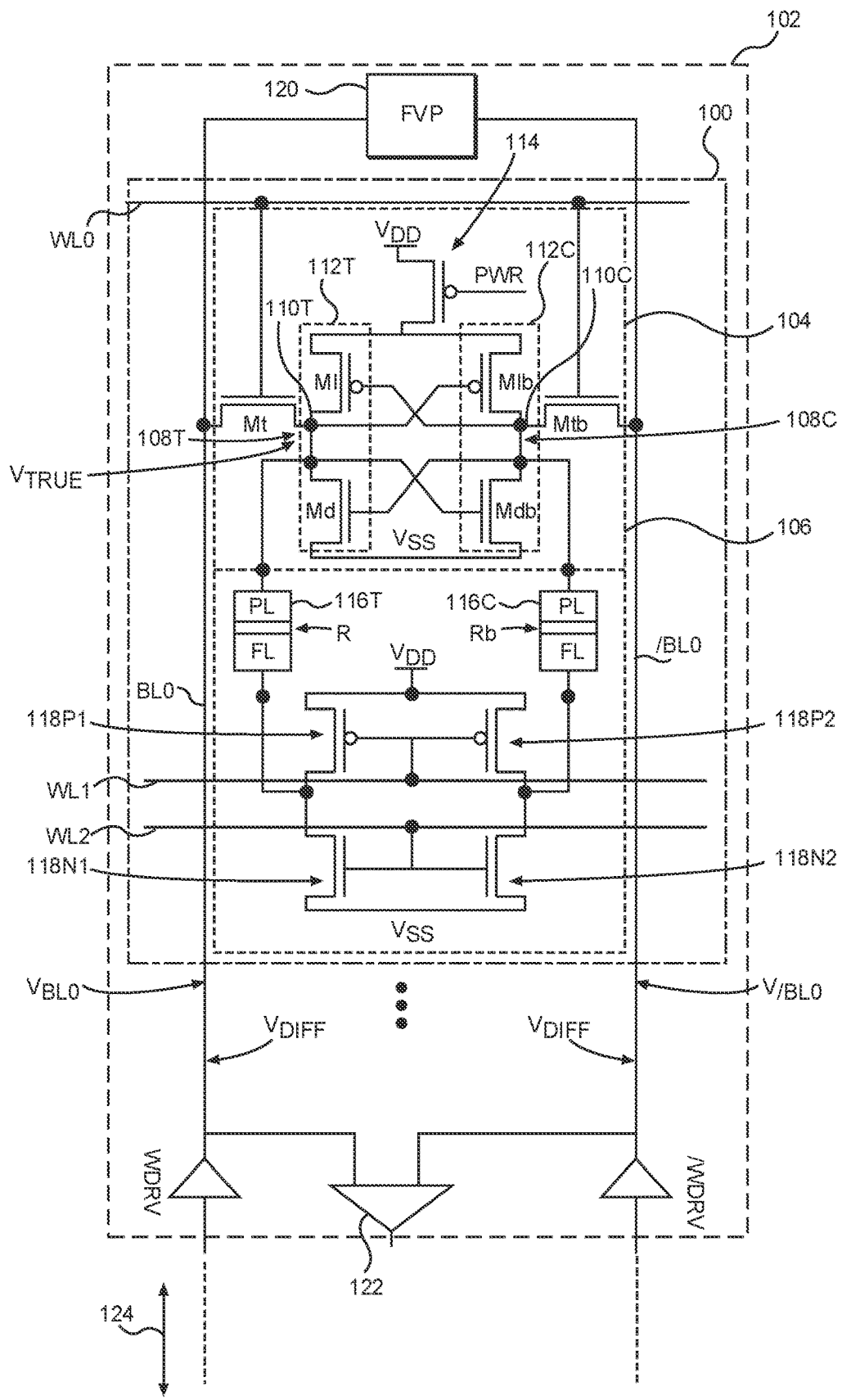
FIG. 1 is a schematic diagram of a conventional memory bit cell circuit including a static random-access memory (SRAM) and a non-volatile memory (NVM) bit cell circuit accessed by a plurality of bit lines and word lines in a memory bit cell array circuit.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include a memory bit cell circuit including a bit line coupled to a static random-access memory (SRAM) bit cell and a non-volatile memory (NVM) bit cell. Methods of accessing data in memory bit cell circuits of the memory bit cell array circuit are also disclosed. A memory bit cell circuit includes an SRAM bit cell circuit for low access latency and long-term reliability and also includes an NVM bit cell circuit for storing data without supplied power. A conventional array of memory bit cell circuits including SRAM and NVM bit cell circuits and a plurality of access lines (e.g., word lines and/or bit lines) for accessing data stored in both circuits occupy a large area of a die. An exemplary memory bit cell circuit, including a bit line coupled to an SRAM bit cell circuit and an NVM bit cell circuit, each with reduced transistor count for reduced area and reduced power consumption, is included in a memory bit cell array circuit. The SRAM bit cell circuit includes cross-coupled true and complement inverters and a first access circuit, coupled to the bit line. The NVM bit cell circuit includes an NVM device coupled to the bit line by a second access circuit and is coupled to the SRAM bit cell circuit. Data stored in the SRAM bit cell circuit and the NVM bit cell circuit are accessed based on voltages on the bit line. In an example, a true SRAM data is determined by an SRAM read voltage on the bit line, and an NVM data in the NVM bit cell circuit is determined by a first NVM read voltage on the bit line.

Figure 2:
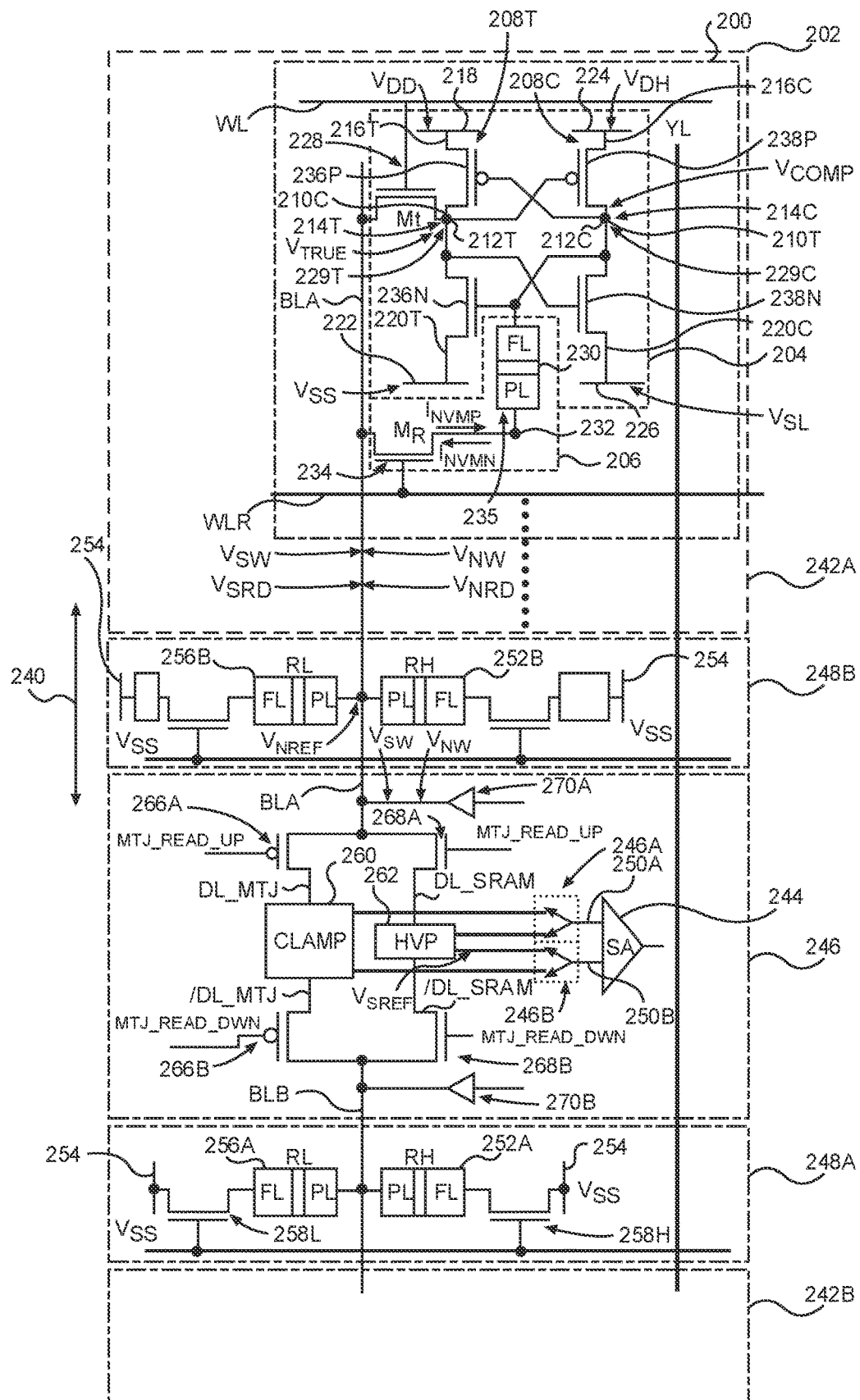
FIG. 2 is a schematic diagram of an exemplary memory bit cell array circuit including an exemplary memory bit cell circuit including a bit line coupled to an SRAM bit cell circuit and an NVM bit cell circuit having reduced transistor counts for reduced area and power consumption.

To better understand the exemplary memory bit cell circuit 200 in the memory bit cell array circuit 202 illustrated in FIG. 2 and inventive aspects thereof, a description of a conventional memory bit cell circuit 100 is first provided with reference to FIG. 1. The memory hit cell circuit 100 is included in a memory bit cell array circuit 102. The memory bit cell circuit 100 includes a static random-access memory (SRAM) bit cell circuit 104 and a non-volatile memory (NVM) bit cell circuit 106, In the presence of a supply voltage $V_{DD}$ provided to the memory bit cell circuit 100, a true data 108T is stored as a voltage $V_{TRUE}$ in a first node 110T of the SRAM bit cell circuit 104. The true data 108T is a binary data bit that can continue to be stored in the NVM bit cell circuit 106 when the supply voltage $V_{DD}$ is no longer provided. The memory bit cell circuit 100 can be employed in, for example, a mobile device where the performance of the SRAM bit cell circuit 104 is important in software applications and communication, and where battery power is not required to maintain the stored data when the mobile device is not in use.

In more detail, the first and second nodes 110T and 110C are outputs of respective cross-coupled inverters 112T and 112C powered by the supply voltage $V_{DD}$ through a switch 114 controlled by a power signal PWR. The inverter 112T and the inverter 112C include transistors Ml and Mlb, respectively, coupled to the supply voltage $V_{DD}$ and include the transistors Md and Mdb, respectively coupled to a ground voltage $V_{SS}$. An access circuit Mt is activated by the word line WL0 to store the true data 108T in the first node 110T based on a voltage $V_{BL0}$ supplied by a driver WDRV on a bit line BL0. Access circuit Mtb is also activated by the word line WL0 to store a complement data 108C in a second node 110C based on a voltage $V_{/BL0}$ supplied by a driver /WDRV on a bit line /BL0. The true data 108T and the complement data 108C are stored into the NVM devices 116T and 116C as resistances R and Rb based on current provided through power switches 118P1, 118P2, 118N1, and 118N2, which are controlled by word lines WL1 and WL2. The resistances R and Rb are maintained when the supply voltage $V_{DD}$ is turned off. When the supply voltage is turned back on, a difference between the resistances R and Rb is employed to restore the true data 108T and complement data 108C into the SRAM bit cell circuit 104. The bit lines BL0 and /BL0 of the memory bit cell array circuit 102 are pre-charged to the supply voltage $V_{DD}$ by the full $V_{DD}$ pre-charge (FVP) circuit 120. Subsequently, by activating the access circuits Mt and Mtb, a true voltage $V_{BL0}$ based on the true data 108T is supplied to the bit line BL0, and a complement voltage $V_{/BL0}$ is supplied to the bit line /BL0. A sense amplifier circuit 122 coupled to the bit lines BL0 and /BL0 compares the true voltage $V_{BL0}$ and complement voltage $V_{/BL0}$ and determines the true data 108T based on a voltage differential $V_{DIFF}$ between the true voltage $V_{BL0}$ and complement voltage $V_{/BL0}$. The memory bit cell circuit 100 is one of 512 memory bit cell circuits 100 in a column 124 of the memory bit cell array circuit 102 coupled to the bit line BL0 and /BL0. Thus, significant power is consumed each time data is read from one of the memory bit cell circuits 100.

FIG. 2 is a schematic diagram of the memory bit cell array circuit 202, including the memory bit cell circuit 200 in which both a SRAM bit cell circuit 204 and an NVM bit cell circuit 206 are accessed by a bit line BLA. Like the memory bit cell circuit 100 in FIG. 1, the memory bit cell circuit 200 in FIG. 2 benefits from the performance of the SRAM bit cell circuit 204 and the power savings of the NVM bit cell circuit 206, but the memory bit cell circuit 200 has a reduced number of devices, reduced area, and lower power consumption compared to the memory bit cell circuit 100.

In particular, the SRAM bit cell circuit 204 includes a true inverter circuit 208T and a complement inverter circuit 208C in a cross-coupled configuration. In this regard, the true inverter circuit 208T includes a true input node 210T and a true output node 212T that forms a true storage node 214T. The complement inverter circuit 208C includes a complement input node 210C coupled to the true output node 212T and a complement output node 212C that forms a complement storage node 214C coupled to the true input node 210T. In this regard, the true inverter circuit 208T and the complement inverter circuit 208C are in a cross-coupled configuration.

The true inverter circuit 208T also includes a true power node 216T coupled to a supply voltage rail 218 and a true ground node 220T coupled to a ground voltage rail 222. The complement inverter circuit 208C also includes a complement power node 216C coupled to a high voltage rail 224 and a complement ground node 220C coupled to a low voltage rail 226. The SRAM bit cell circuit 204 also includes a first access circuit 228 coupled to the true storage node 214T and the bit line BLA The first access circuit 228 corresponds to the access circuit Mt in FIG. 1. The first access circuit 228 is controlled by a word line WL. The supply voltage $V_{DD}$ is supplied to the supply voltage rail 218. A ground voltage $V_{SS}$ is supplied to the ground voltage rail 222. Either the supply voltage $V_{DD}$ or a higher voltage $V_{DH}$, higher than the supply voltage $V_{DD}$, is supplied to the high voltage rail 224, depending on an operation being performed. The low voltage rail 226 is supplied either the ground voltage $V_{SS}$ or a lower voltage $V_{SL}$, lower than the ground voltage $V_{SS}$, depending on an operation being performed. The SRAM bit cell circuit 204 is configured to, in response to the first access circuit 228 coupling the bit line BLA to the true input node 210T with an SRAM write voltage $V_{SW}$ supplied to the bit line BLA, store a true SRAM data 229T on the true storage node 214T and store a complement SRAM data 229C on the complement storage node 214C. The true SRAM data 229T is stored on the true storage node 214T as a true storage node voltage $V_{TRUE}$. The complement SRAM data 229C is stored on the complement storage node 214C as a complement storage node voltage $V_{COMP}$.

The NVM bit cell circuit 206 of the memory bit cell circuit 200 includes an NVM device 230 to perform the data storage achieved by the two NVM devices 116T and 116C in FIG. 1. The NVM device 230 may comprise a magnetic random-access memory (MRAM) device a magnetic tunnel junction (MTJ) device, a spin torque transfer (STT) MRAM device, a resistive random-access memory (RRAM) device, or another type of two terminal NVM device 230. The NVM device 230 is coupled between the complement output node 212C and a first node 232 of the memory bit cell array circuit 202. The NVM bit cell circuit 206 also includes a second access circuit 234 coupled to the first node 232 and to the bit line BLA. The second access circuit 234 couples the first node 232 to the bit line BLA in response to the word line WLR.

To store a binary NVM data 235 in the NVM bit cell circuit 206, a corresponding complement SRAM data 229C is first stored in the complement storage node 214C. An NVM write voltage $V_{NW}$ is supplied to the first bit line, and the second access circuit 234 is activated to couple the NVM device 230 to the bit line BLA. Based on the NVM write voltage $V_{NW}$ and the complement storage node voltage $V_{COMP}$, the NVM device 230 conducts a first NVM current $I_{NVMP}$ or a second NVM current $I_{NVMN}$. In particular, in the example in FIG. 2, the first NVM current $I_{NVMP}$ flows in a first direction, and the second NVM current $I_{NVMN}$ flows in a second direction. Depending on an orientation of the NVM device 230 coupled to the second access circuit 234 and to the complement storage node 214C, the NVM device 230 will attain either a low resistance (LR) state or a high resistance (HR) state in response to the first NVM current $I_{NVMP}$, and the NVM device 230 will attain either an LR state or an HR state in response to the first NVM current $I_{NVMP}$. Thus, in response to the second access circuit 234 coupling the NVM device 230 to the bit line BLA, the NVM device 230 stores the binary NVM data 235 based on conducting the first NVM current $I_{NVMP}$ in the first direction between the bit line BLA and the complement storage node 214C or conducting the second NVM current $I_{NVMN}$ in the second direction between the bit line BLA and the complement storage node 214C.

The true inverter circuit 208T, in the example in FIG. 2, includes a P-type transistor 236P coupled to the true storage node 214T and the true power node 216T and an N-type transistor 236N coupled to the true storage node 214T and the true ground node 220T. The P-type transistor 236P and the N-type transistor 236N are referred to collectively as the true inverter transistors 236. The complement inverter circuit 208C, in the example in FIG. 2, includes a P-type transistor 238P coupled to the complement storage node 214C and the complement power node 216C, and an N-type transistor 238N coupled to the complement storage node 214C and the complement ground node 220C. The P-type transistor 236P and the N-type transistor 236N of the true inverter circuit 208T are sized according to the power and area requirements of an SRAM bit cell circuit 204 coupled to the supply voltage $V_{DD}$ and a ground voltage $V_{SS}$. However, at a size needed for an SRAM bit cell circuit 204, the true inverter circuit 208T does not have sufficient capacity to conduct the first NVM current $I_{NVMP}$ or the second NVM current $I_{NVMN}$ required to put the NVM device 230 in the LR state or the HR state, In the SRAM bit cell circuit 204, the complement inverter circuit 208C must provide the first NVM current $I_{NVMP}$ or the second NVM current $I_{NVMN}$. To avoid the need to increase a size of the P-type and N-type transistors 238P and 238N in the complement inverter circuit 208C to a size large enough to drive the first NVM current $I_{NVMP}$ or the second NVM current $I_{NVMN}$, the complement inverter circuit 208C is instead coupled to a higher voltage $V_{DH}$ that is higher than the supply voltage $V_{DD}$ and a lower voltage $V_{SL}$ that is lower than the ground voltage $V_{SS}$. In this manner, the gate to source voltages of the P-type transistor 238P and the N-type transistor 238N are increased to correspondingly increase their current driving capabilities to a level sufficient to conduct the first NVM current $I_{NVMP}$ or the second NVM current $I_{NVMN}$ without an increase in size. Thus, in response to the second access circuit 234 coupling the first node 232 to the bit line BLA, the complement inverter circuit 208C is configured to conduct one of the first NVM current $I_{NVMP}$ in the first direction or the second NVM current $I_{NVMN}$ in the second direction through the NVM device 230.

In this regard, the power switches 118P1, 118P2, 118N1, and 118N2 and word lines WL1 and WL2 in the NVM bit cell circuit 106 of FIG. 1 are replaced by the second access circuit 234 and word line WLR in the NVM bit cell circuit 206. Additionally, the memory bit cell circuit 200 in FIG. 2 does not include a second bit line corresponding to the bit line /BL0 in FIG. 1 or an access circuit corresponding to the access circuit Mtb in FIG. 1. In FIG. 2, the complement storage node 214C couples only to the true input node 210T and to the NVM device 230.

In another aspect, the SRAM bit cell circuit 204 does not include a switch, like switch 114 in FIG. 1, providing supply voltage $V_{DD}$ to the true inverter circuit 208T and the complement inverter circuit 208C. Thus, the memory bit cell circuit 200 has a reduced number of devices and fewer word lines and hit lines compared to the memory bit cell circuit 100 in FIG. 1, which reduces an area occupied by each of the memory bit cell circuits 200 in the memory bit cell array circuit 202.

Other differences between the memory bit cell array circuit 202 and the memory bit cell array circuit 102 are further explained with continued reference to FIG. 2. As discussed above, the bit line BL0 and the bit line /BL0 in FIG. 1 are each coupled to all 512 memory hit cell circuits 100 in the column 124 of the memory bit cell array circuit 102 and are also coupled to the sense amplifier circuit 122. The sense amplifier circuit 122 in FIG. 1 determines the true data 108T stored in the SRAM bit cell circuit 104 of a selected one of the 512 memory hit cell circuits 100 by comparing a true voltage $V_{BL0}$ supplied to the bit line BL0 from the first node 110T to a complement voltage $V_{/BL0}$ supplied to the bit line /BL0 from the second node 110C.

Since the memory bit cell circuit 200 includes the bit line BLA but not a complementary bit line that can be used to sense a differential voltage, an alternative method is needed to determine a true voltage $V_{BL0}$ of the true storage node 214T. Only one memory bit cell circuit 100 is accessed in the column 124 in each read access operation in FIG. 1, and the same is true of memory bit cell circuits 200 in the column 240 in FIG. 2. Thus, the column 240 of the memory bit cell array circuit 202 has been divided into a first plurality 242A of the memory bit cell circuits 200 and a second plurality 242B, each including 256 memory bit cell circuits 200. The first plurality 242A includes the bit line BLA and the second plurality 242B includes a bit line BLB. As explained below, the bit line BLB can be compared to the bit line BLA, and vice versa, in a read operation.

The first plurality 242A and the second plurality 242B of memory bit cell circuits 200 are also referred to herein as a first bank 242A and a second bank 242B. The memory bit cell circuits 200 in the first bank 242A are coupled to the bit line BLA, and the memory bit cell circuits 200 in the second bank 242B are coupled to the bit line BLB. The bit lines BLA and BLB are both coupled to a sense amplifier circuit 244 in an array access circuit 246. The array access circuit 246 is employed during operations to read or write (store) the true SRAM data 229T in the true storage node 214T of the SRAM bit cell circuit 204 or the binary NVM data 235 of the NVM bit cell circuit 206 in any of the memory bit cell circuits 200 in either one of the first bank 242A and the second bank 242B.

The memory bit cell circuit 200 being accessed in a read operation is either coupled to the bit line BLA or to the bit line BLB, leaving the other unused. In this regard, the unused one of the bit lines BLA and BLB is available and is used to provide a reference for the sense amplifier circuit 244. The unused one of the bit lines BLA and BLB can be coupled to a first NVM reference circuit 248A to provide an NVM reference voltage $V_{NREF}$ for reading the NVM bit cell circuit 206. An SRAM reference voltage $V_{SREF}$ for reading the SRAM bit cell circuit 204 may be generated internally within the array access circuit 246 and supplied to the sense amplifier circuit 244.

As discussed above, the memory bit cell array circuit 202 includes a bit line BLA and a bit line BLB. The memory bit cell array circuit 202 includes the first plurality 242A of memory bit cell circuits 200 that are each coupled to the bit line BLA. The first plurality 242A of memory bit cell circuits 200 each include a SRAM bit cell circuit 204 that, in response to receiving a supply voltage $V_{DD}$, store the true SRAM data 229T on the true storage node 214T and store the complement SRAM data 229C on the complement storage node 214C. The SRAM bit cell circuit 204 also includes the first access circuit 228 coupled to the true storage node 214T and the bit line BLA. Each memory bit cell circuit 200 also includes the NVM bit cell circuit 206 that stores the binary NVM data 235 independent of whether the SRAM bit cell circuit 204 is receiving the supply voltage $V_{DD}$ or not. The NVM bit cell circuit 206 includes the NVM device 230 coupled to the complement storage node 214C of the SRAM bit cell circuit 204 and to the first node 232. The NVM bit cell circuit 206 also includes the second access circuit 234 coupled to the first node 232 and the bit line BLA. The memory bit cell array circuit 202 also includes the array access circuit 246 coupled to the bit line BLA. The array access circuit 246 determines the true SRAM data 229T based on an SRAM read voltage $V_{SRD}$ on the bit line BLA. The array access circuit 246 determines the binary NVM data 235 based on an NVM read voltage $V_{NRD}$ on the bit line BLA.

The array access circuit 246 includes the sense amplifier circuit 244, including a first input 250A and a second input 250B. The sense amplifier circuit 244 compares voltages on the first input 250A and the second input 250B, In a read operation of the SRAM bit cell circuit 204, the sense amplifier circuit 244 compares the SRAM read voltage $V_{SRD}$ on the bit line BLA to the SRAM reference voltage $V_{SREF}$. The SRAM reference voltage $V_{SREF}$ is a voltage provided by the array access circuit 246 and is between the supply voltage $V_{DD}$ and the ground voltage $V_{SS}$. In a read operation of the NVM bit cell circuit 206, the sense amplifier circuit 244 compares the NVM read voltage $V_{NRD}$ to the NVM reference voltage $V_{NREF}$. The NVM reference voltage $V_{NREF}$ is supplied to the bit line BLB by the first NVM reference circuit 248A.

As noted previously, the NVM device 230 (e.g., an MRAM device) is configured to have a first resistance state in response to a first NVM current $I_{NVMP}$ in a first direction and a second resistance state in response to a second NVM current $I_{NVMN}$ in a second direction. The first resistance state is one of a LR state or a HR state, and the second resistance state is the other one of the LR state and the HR state. The first NVM reference circuit 248A includes a first HR NVM device 252A coupled to the bit line BLB and to a ground voltage node 254, and a LR NVM device 256A coupled to the bit line BLB and the ground voltage node 254. The first HR NVM device 252A is in the HR state and the LR NVM device 256A is in the LR state. Write control switches 258L and 258H couple the first HR NVM device 252A and the LR NVM device 256A to ground. voltage nodes 254.

A second NVM reference circuit 248B includes a second HR NVM device 252B coupled to the bit line BLA and to the ground voltage node 254 and a second LR NVM device 256B coupled to the bit line BLA and to the ground voltage node 254. The second NVM reference circuit 248B is coupled to the bit line BLA to supply the NVM reference voltage $V_{NREF}$ to the sense amplifier circuit 244 on the bit line BLA for read operations of the binary NVM data 235 in a memory bit cell circuit 200 in the second plurality 242B of memory bit cell circuits 200 in the memory bit cell array circuit 202. The array access circuit 246 compares the NVM read voltage $V_{NRD}$ on the bit line BLB coupled to the second input 250B of the sense amplifier circuit 244 to the NVM reference voltage $V_{NREF}$ on the bit line BLA coupled to the first input 250A.

The array access circuit 246 is employed in both read and write operations. The sense amplifier circuit 244 in the array access circuit 246 is employed in read operations of both the SRAM bit cell circuit 204 and the NVM bit cell circuit 206. In addition to the sense amplifier circuit 244, the array access circuit 246 includes a clamp circuit 260 and a half $V_{DD}$ pre-charge (HVP) circuit 262. The clamp circuit 260 is employed in read operations of the WM bit cell circuit 206, and the HVP circuit 262 is employed in read operations of the SRAM bit cell circuit 204. The array access circuit 246 includes input selectors 264A and 264B to couple the first and second inputs 250A and 250B of the sense amplifier circuit 244 to either the clamp circuit 260 or the HVP circuit 262. The array access circuit 246 also includes bit line selectors 266A and 266B to couple the clamp circuit 260 to the bit line BLA or the bit line BLB. The bit line selector 266A couples a node DL_MTJ to the bit line BLA in response to the signal MTJ_READ_UP, and the bit line selector 266B couples a node /DJ_MTJ to the bit line BLB in response to the signal MTJ_READ_DWN. The array access circuit 246 also includes bit line selectors 268A and 268B to couple the HVP circuit 262 to the bit line BLA or the bit line BLB. The bit line selector 268A couples a node DL_SRAM to the bit line BLA in response to the signal MTJ_READ_UP, and the bit line selector 266B couples a node /DL_SRAM to the bit line BLB in response to the signal MTJ_READ_DWN. Only one of the clamp circuit 260 and the HVP circuit 262 is coupled to the bit line BLA and the bit line BLB at a time, depending on whether a read operation is directed to the SRAM bit cell circuit 204 or the NVM bit cell circuit 206 in a memory bit cell circuit 200 in one of the first bank 242A and the second bank 242B.

In a read operation of the SRAM bit cell circuit 204 in a memory bit cell circuit 200 in the first plurality 242A of memory bit cell circuits 200, the HVP circuit 262 couples the bit line BLA to the first input 250A of the sense amplifier circuit 244 and couples an SRAM reference voltage $V_{SREF}$ to the second input 250B of the sense amplifier circuit 244. In a read operation of the NVM bit cell circuit 206 in a memory bit cell circuit 200 in the first plurality 242A of memory bit cell circuits 200, the clamp circuit 260 couples the bit line BLA to the first input 250A of the sense amplifier circuit 244 and couples the bit line BLB to the second input 250B of the sense amplifier circuit 244.

The array access circuit 246 also includes write drivers 270A and 270B to drive an SRAM write voltage $V_{SW}$ or an NVM write voltage $V_{NW}$ onto the bit lines BLA and BLB, respectively. In other words, the first write driver 270A is coupled to the bit line BLA and writes the true SRAM data 229T into the SRAM bit cell circuit 204 of the memory bit cell circuits 200 of the first plurality 242A of memory bit cell circuits 200. The second write driver 270B is coupled to the bit line BLB and writes a true SRAM data 229T into the SRAM bit cell circuit 204 of the memory bit cell circuits 200 of the second plurality 242B of the memory bit cell circuits 200.

Further details of the memory bit cell array circuit 202 are discussed in the context of descriptions of read and write operations for accessing the SRAM bit cell circuit 204 and the NVM bit cell circuit 206.

Figure 3:
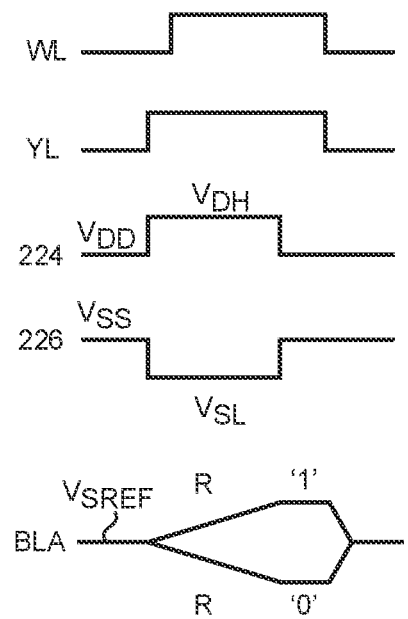
FIG. 3 is a timing diagram of signals in a read operation for reading a true SRAM data stored in the SRAM bit cell circuit in the memory bit cell circuit in FIG. 2.

A timing diagram illustrating a read operation of the SRAM bit cell circuit 204 is shown in FIG. 3 and is described with reference to FIG. 2. The timing diagram indicates voltage levels of control signals in the memory bit cell array circuit 202. In particular, a word line WL controls the first access circuit 228 in FIG. 2, and a power signal YL activates the supply voltage $V_{DD}$ to the first plurality 242A of memory bit cell circuits 200. The high voltage rail 224 and the low voltage rail 226 coupled to the complement inverter circuit 208C are shown. In FIG. 3, the read operation begins with power signal YL activating the supply voltage $V_{DD}$ to the true inverter circuit 208T. For this operation, the high voltage rail 224 is increased from the supply voltage $V_{DD}$ to the higher voltage $V_{DH}$, and the low voltage rail 226 is decreased from the ground voltage $V_{SS}$ to the lower voltage $V_{SL}$. The higher voltage $V_{DH}$ may be in the range of 25% to 40% higher than the supply voltage $V_{DD}$, and the lower voltage $V_{SL}$, may be in the range of 25% to 40% lower than the ground voltage $V_{SS}$. The bit line BLA is pre-charged with the SRAM reference voltage $V_{SREF}$, which is half supply voltage $V_{DD}/2$ (i.e., half of the supply voltage $V_{DD}$. The SRAM reference voltage $V_{SREF}$ is supplied to the bit line BLA by the HVP circuit 262. Since only the bit line BLA is pre-charged and not the bit line BLB, power consumption is reduced compared to the conventional memory bit cell array circuit 102 in FIG. 1.

Returning to FIG. 2, when the word line WL activates the first access circuit 228, the bit line BLA is either raised from the SRAM reference voltage $V_{SREF}$ to the supply voltage $V_{DD}$ or drops to the ground voltage $V_{SS}$ to indicate the SRAM read voltage $V_{SRD}$. The array access circuit 246 determines the true SRAM data 229T by comparing the SRAM read voltage $V_{SRD}$ on the bit line BLA to the SRAM reference voltage $V_{SREF}$ supplied to the sense amplifier circuit 244 by the HVP circuit 262. By supplying the higher voltage $V_{DH}$ and the lower voltage $V_{SL}$ to the complement inverter circuit 208C, the complement output node 212C provides a stronger bias to the P-type and N-type transistors 236P and 236N, allowing bit line BLA to either be quickly discharged from the SRAM reference voltage $V_{SREF}$ or to be quickly raised to the supply voltage $V_{DD}$ to indicate either a binary "1" or "0". As the bit line BLA reaches either supply voltage $V_{DD}$ or ground voltage $V_{SS}$, the high voltage rail 224 is returned to supply voltage $V_{DD}$, and the low voltage rail 226 is returned to ground voltage $V_{SS}$.

Figure 4:
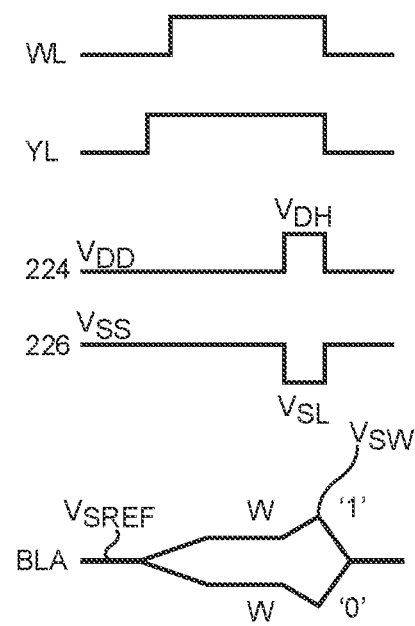
FIGS. 4 is a timing diagram of signals in a write operation for writing a true SRAM data into the SRAM bit cell circuit in the memory bit cell circuit in FIG. 2.

A timing diagram illustrating a write operation of the SRAM bit cell circuit 204 is shown in FIG. 4 and is described with further reference to FIG. 2. After the power signal YL activates the supply voltage $V_{DD}$, the bit line BLA is pre-charged to the SRAM reference voltage $V_{SREF}$, and the word line WL activates the first access circuit 228. The write driver 270A in FIG. 2 270A in FIG. 2 supplies the bit line BLA with an SRAM write voltage $V_{SW}$ to begin raising or lowering the bit line BLA from the SRAM reference voltage $V_{SREF}$. The supply voltage $V_{DD}$ on the high voltage rail 224 is raised to the higher voltage $V_{DH}$ and the ground voltage $V_{SS}$ on the low voltage rail 226 is reduced to the lower voltage $V_{SL}$ to increase the bias on the P-type and N-type transistors 236P and 236N to reduce a time for transitioning the bit line BLA to the desired SRAM write voltage $V_{SW}$ for a binary "1" or "0" is reduced.

Referring again to FIG. 2, reading the binary NVM data 235 of the NVM bit cell circuit 206 requires passing a small read current $I_{RD}$ through the NVM device 230 to determine whether the NVM device 230 is in a LR state or a HR state. To do so, a true SRAM data 229T corresponding to a high voltage (i.e., supply voltage $V_{DD}$) is written in the true storage node 214T, which couples the complement storage node 214C and the NVM device 230 to the low voltage rail 226 supplied with the ground voltage $V_{SS}$. Then, a read operation of the NVM bit cell circuit 206 in a memory bit cell circuit 200 employs the clamp circuit 260 to supply an NVM read pre-charge voltage $V_{PRE}$ (not shown) to the bit lines BLA and BLB. The word line WLR activates the second access circuit 234, coupling the pre-charged bit line BLA to the NVM device 230. An NVM read voltage $V_{NRD}$ on the bit line BLA depends on whether the NVM device 230 is in the HR state or the LR state. The NVM reference voltage $V_{NREF}$ is generated on the bit line BLB by the first NVM reference circuit 248A. The NVM reference voltage $V_{NREF}$ is proportional to a resistance RH of the first HR NVM device 252A plus a resistance RL of the LR NVM device 256A (e.g., (RL+RH)/2), The NVM read voltage $V_{NRD}$ is lower than the NVM reference voltage $V_{NREF}$ if the NVM device 230 in the NVM bit cell circuit 206 is in the LR state and the NVM read voltage $V_{NRD}$ is higher than the NVM reference voltage $V_{NREF}$ if the NVM device 230 in the NVM bit cell circuit 206 is in the HR state. Thus, by comparing the NVM read voltage $V_{NRD}$ on bit line BLA and the NVM reference voltage $V_{NREF}$ on bit line BLB, the sense amplifier circuit 244 determines the binary NVM data 235.

Writing the binary NVM data 235 of the NVM bit cell circuit 206 requires passing the first NVM current $I_{NVMP}$ through the NVM device 230 in the first direction to put the NVM device 230 in the HR state and the second NVM current $I_{NVMN}$ in the second direction to put the NVM device 230 in the LR state. As previously noted, the complement inverter circuit 208C is coupled between the high voltage rail 224 and the low voltage rail 226, which are supplied the higher voltage $V_{DH}$ and the lower voltage $V_{SL}$, which provides a higher bias voltage (e.g., gate to source voltage) to the P-type and. N-type transistors 238P and 238N.

To write the binary NVM data 235 corresponding to the LR state, the true storage node 214T is written with true SRAM data 229T corresponding to the ground voltage $V_{SS}$ to couple the complement storage node 214C to the high voltage rail 224. The write driver 270A supplies the ground voltage $V_{SS}$ to the bit line BLA. The word line WLR activates the second access circuit 234 to couple the NVM device 230 between the higher voltage $V_{DH}$ on the high voltage rail 224 and the ground voltage $V_{SS}$ on the bit line BLA. Herein, a value of the binary NVM data 235 may correspond to the LR state or the HR state depending on programming practice. For example, the LR state may correspond. to either a binary "0" or a binary "1," and the HR state may correspond to the other one of the binary "1" or the binary "0".

To write the binary NVM data 235 corresponding to the HR state, the true storage node 214T is written with true SRAM data 229T corresponding to the supply voltage $V_{DD}$ to couple the complement storage node 214C to the low voltage rail 226. The write driver 270A supplies the supply voltage $V_{DD}$ to the bit line BLA, and the word line WLR activates the second access circuit 234 to couple the NVM device 230 between the lower voltage $V_{SL}$ on the low voltage rail 226 and the supply voltage $V_{DD}$ on the bit line BLA. Similarly, a write driver 270B is coupled to the bit line BLB.

Details of the HVP circuit 262, clamp circuit 260, and the sense amplifier circuit 244 are discussed with reference to the schematic circuit diagrams in FIGS. 5-8.

Figure 5:
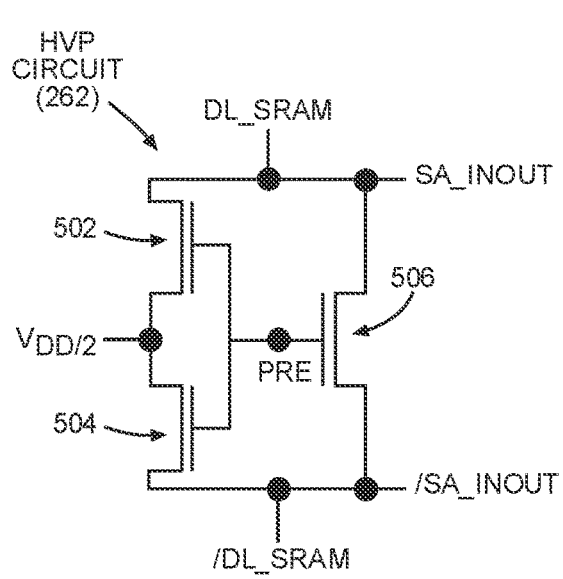
FIG. 5 is a schematic diagram of a half $V_{DD}$ pre-charge (HVP) circuit in an array access circuit for reading a true SRAM data of an SRAM bit cell circuit in the memory bit cell array circuit in FIG. 2.

The HVP circuit 262 in FIG. 5 is described with reference to circuits in FIG. 2. The HVP circuit 262 includes transistors 502, 504, and 506 that, in response to being activated by pre-charging the gate node PRE, half supply voltage $V_{DD}/2$ (i.e., half of the supply voltage $V_{DD}$) to node DL_SRAM and node /DL_SRAM. The node DL_SRAM is coupled to the bit line BLA by the input selector 264A in FIG. 2, and the node /DL_SRAM is coupled to the bit line BLB by the input selector 264B.

Figure 6:
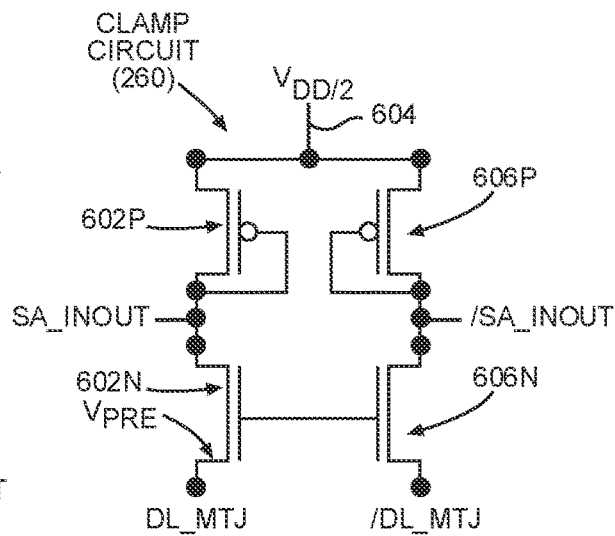
FIG. 6 is a schematic diagram of a clamp circuit in an array access circuit for reading an NVM data of an NVM bit cell circuit in the memory bit cell array circuit in FIG. 2.

The clamp circuit 260 in FIG. 6 is described with reference to circuits in FIG. 2. The clamp circuit 260 includes an upper transistor 602P coupled to a voltage source node 604 that is supplied the voltage $V_{DD}/2$, which is an intertmediate voltage less than the supply voltage $V_{DD}$. The upper transistor 602P is also coupled to a node SA_INOUT that is coupled to the first input 250A of the sense amplifier circuit 244 (by way of the bit line selector 266A). The clamp circuit 260 includes an upper transistor 606P coupled to the voltage source node 604 and a node /SA_INOUT that is coupled to the second input 250B of the sense amplifier circuit 244 (by way of the bit line selector 266B). The clamp circuit 260 includes a lower transistor 602N coupled to the node SA_INOUT and a node DL_MTJ. The clamp circuit 260 includes a lower transistor 606N coupled to the node /SA_INOUT and a node /DL_MTJ. The nodes SA_INOUT and /SA_INOUT are coupled to the input selectors 264A and 264B, respectively, to be compared on the first and second inputs 250A and 250B of the sense amplifier circuit 244. The nodes DL_MTJ and /DL_MTJ are coupled to the bit lines BLA and BLB, respectively, by the bit line selectors 266A and 266B.

To generate the NVM read pre-charge voltage $V_{PRE}$ (not shown) on the bit lines BLA and BLB, the lower transistors 602N and 606N are partially activated in an analog manner to reduce voltage at the nodes SA_INOUT and /SA_INOUT, which in turn partially activates the upper transistors 602P and 606P, The upper transistors 602P and 606P are sized with respect to the lower transistors 602N and 606N to produce the desired NVM read pre-charge voltage $V_{PRE}$ on the nodes DL_MTJ and /DL_MTJ. The NVM read pre-charge voltage $V_{PRE}$ is a low voltage level in the range of 20% to 35% of the supply voltage $V_{DD}$ to induce a small read current $I_{RD}$ in the NVM device 230.

Figure 7:
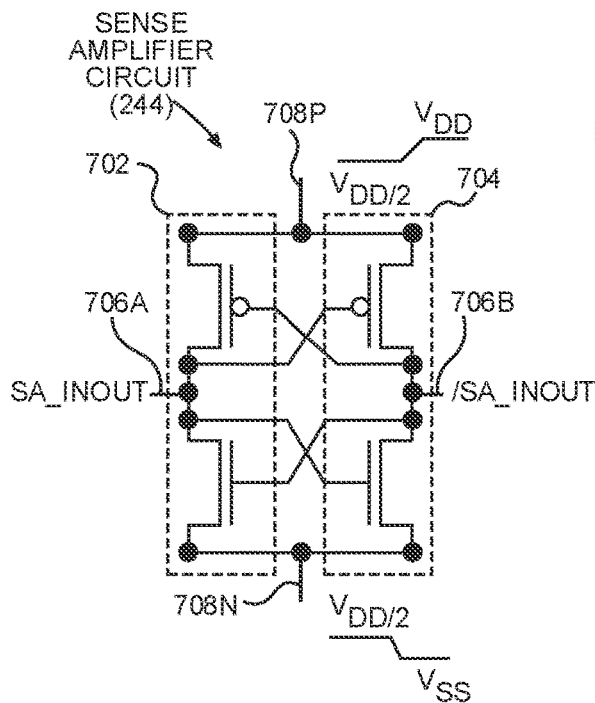
FIG. 7 is a schematic diagram of a sense amplifier circuit in an array access circuit for reading true SRAM data stored in SRAM bit cell circuits and NVM data stored in NVM bit cell circuits in memory bit cell circuits in the memory bit cell array circuit in FIG. 2.

Referring to FIG. 7, a schematic circuit diagram of the sense amplifier circuit 244 is shown and is described with reference to circuits in FIG. 2. The sense amplifier circuit 244 includes cross-coupled inverters 702 and 704 with a first input node 706A coupled to the first input 250A and a second input node 706B coupled to the second input 250B. The sense amplifier circuit 244 is a differential amplifier that detects and amplifies a difference between the input nodes 706A and 706B. Initially, power nodes 708P and 708N are set to half supply voltage $V_{DD}/2$. Any difference in voltage between the input nodes 706A and 706B is amplified as a voltage supplied to the power node 708P is increased to the supply voltage $V_{DD}$, and a voltage supplied to the power node 708N is decreased to the ground voltage $V_{SS}$.

Figure 8:
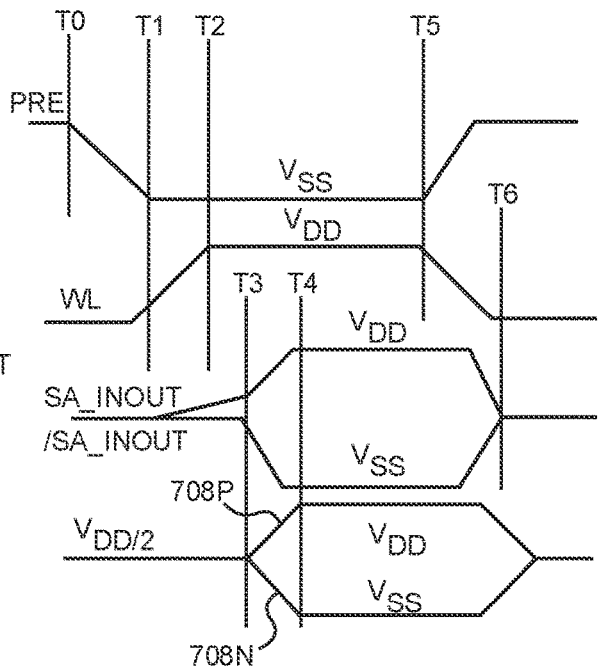
FIG. 8 is a timing diagram illustrating signals in the array access circuit in a read operation of a true SRAM data in the memory bit cell array circuit in FIG. 2.

Operation of the sense amplifier circuit 244 in an SRAM read operation is illustrated in the timing diagrams in FIG. 8 and described with reference to FIGS. 2, 5, and 7, As the gate node PRE of the HVP circuit 262 is discharged to the ground voltage $V_{SS}$ between time T0 and time T1, the nodes DL_SRAM and /DL_SRAM in the HVP circuit 262 are decoupled. From time T1 to time T2, the word line WL activates the first access circuit 228 to couple the true storage node 214T to the bit line BLA. Bit line BLA is coupled to the node DL_SRAM of the HVP circuit 262, which is further coupled to the first input node 706A of the sense amplifier circuit 244 through the node SA_INOUT. The second input node 706B, coupled to node /SA_INOUT, continues to be supplied the half supply voltage $V_{DD}/2$. Coupling the true storage node 214T to the bit line BLA causes the bit line BLA to slowly increase or decrease in voltage through time T2. At time T3, as voltage on the power node 708P is increased to the supply voltage $V_{DD}$ and voltage on the power node 708N is decreased to the ground voltage $V_{SS}$, a difference in voltage between the first input node 706A and the second input node 706B is quickly amplified, as discussed above, until time T4. At time T5, as the gate node PRE is again pre-charged and the word line WL deactivates the first access circuit 228, the input nodes 706A and 706B and the power nodes 708P and 708N return to previous values (at time T6).

Figures 9A, 9B, 9C:
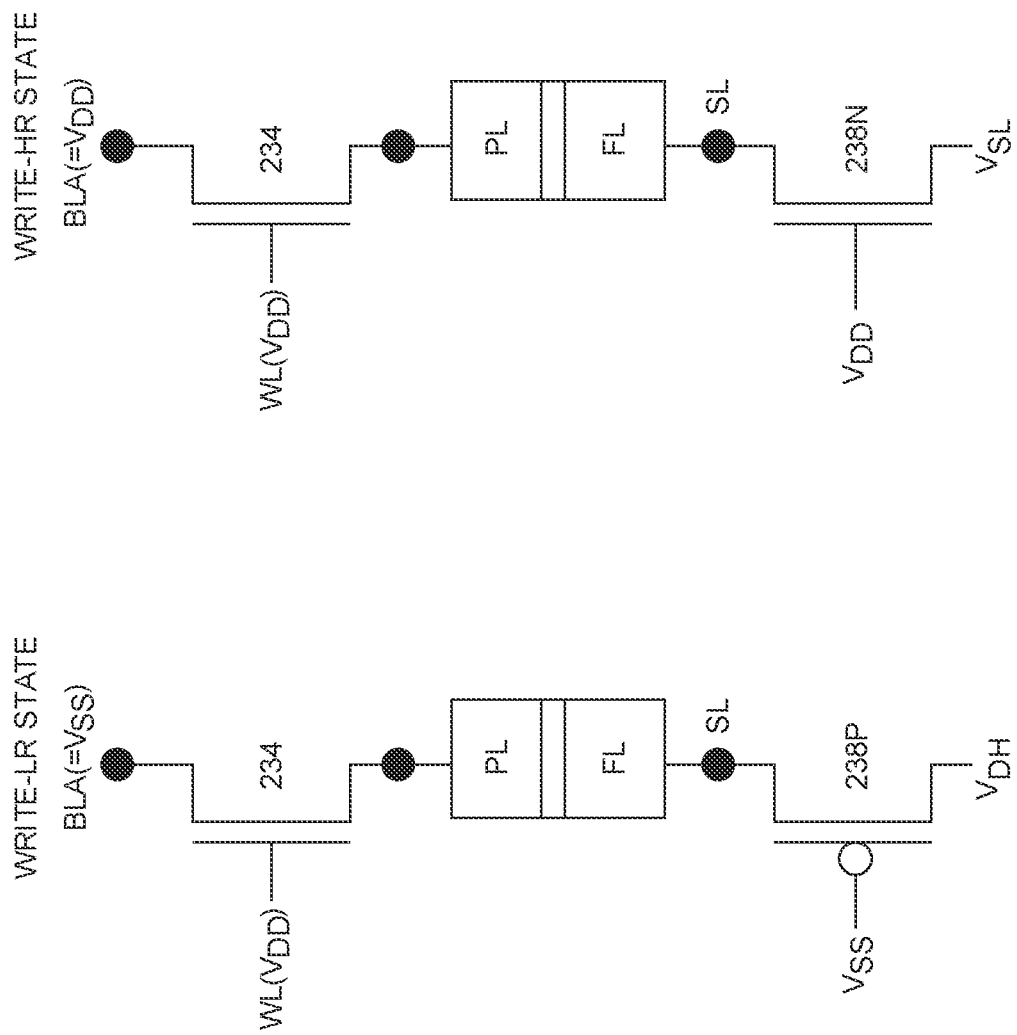
FIGS. 9A-9C illustrate a current path and voltages applied for wilting an NVM data corresponding to a low resistance state, writing an NVM data corresponding to a high resistance state, and reading an NVM data in the NVM bit cell circuit in the memory bit cell circuit in FIG. 2.

FIGS. 9A-9C illustrate current paths for reading and writing the binary NVM data 235 in the NVM device 230. The NVM device 230 in FIGS. 9A-9C includes a pinned layer PL and a free layer FL having magnetizations that are oriented parallel to each other in the LR state or antiparallel to each other in the HR state. FIG. 9A illustrates applied voltages and components in a current path for writing the binary NVM data 235 corresponding to the LR state in the NVM device 230. The ground voltage $V_{SS}$ is supplied to the bit line BLA. The second access circuit 234 couples the bit line BLA to the first node 232 in response to the word line WLR. The true storage node 214T of the SRAM hit cell circuit 204 is prepared by writing a true SRAM data 229T corresponding to the ground voltage $V_{SS}$, which activates the P-type transistor 238P, coupling the complement storage node 214C to the high voltage rail 224. The higher voltage $V_{DH}$ is supplied to the high voltage rail 224. Thus, for writing the current $I_{WR}$ in a direction from high voltage to low voltage, the current path includes the P-type transistor 238P, the NVM device 230, the second access circuit 234, and the bit line BLA. The true SRAM data 229T corresponds to the ground voltage $V_{SS}$ if the value of the true SRAM data 229T is a binary value associated with the ground voltage $V_{SS}$. For example, the ground voltage $V_{SS}$ may correspond to a binary "0" or a binary "1," and the supply voltage $V_{DD}$ may correspond to the other one of the binary "0" or the binary "1".

FIG. 9B illustrates applied voltages and components in a current path for writing the binary NVM data 235 corresponding to the HR state in the NVM device 230. The supply voltage $V_{DD}$ is supplied to the bit line BLA. The second access circuit 234 couples the bit line BLA to the first node 232 in response to the word line WLR. The true storage node 214T of the SRAM hit cell circuit 204 is prepared by writing a true SRAM data 229T corresponding to the supply voltage $V_{DD}$, which activates the N-type transistor 238N, coupling the complement storage node 214C to the low voltage rail 226. The lower voltage $V_{SL}$, is supplied to the low voltage rail 226. Thus, for writing the NVM device 230 into the HR state, a path of current $I_{WR}$ in a direction from high voltage to low voltage includes the bit line BLA, the second access circuit 234, the NVM device 230, and the N-type transistor 238N.

FIG. 9C illustrates applied voltages and components in a current path for reading the binary NVM data 235 in the NVM device 230. The NVM read pre-charge voltage $V_{PRE}$ is supplied to the bit line BLA. The second access circuit 234 couples the bit line BLA to the first node 232 in response to the word line WLR. The true storage node 214T of the SRAM bit cell circuit 204 is prepared by writing a true SRAM data 229T corresponding to the supply voltage $V_{DD}$, which activates the N-type transistor 238N, coupling the complement storage node 214C to the low voltage rail 226. The ground voltage $V_{SS}$ is supplied to the low voltage rail 226. Thus, a current path of the small read current $I_{RD}$ for reading the NVM device 230 includes, in a direction from high voltage to low voltage, the bit line BLA, the second access circuit 234, the NVM device 230, and the N-type transistor 238N.

One limiting factor in the use of memory bit cell circuits 200 with NVM bit cell circuits 206 is limited useful life. NVM devices 230, such as MRAM devices or MTJ devices, cannot reliably store data (i.e., attain and maintain the HR state and the LR state) after a threshold number of write operations. Thus, one methodology applicable to the memory bit cell array circuit 202 is that at initial power on all NVM devices are written to the LR state. In response to an indication that power is being turned off, the true SRAM data 229T is read and, if the true SRAM data 229T corresponds to the HR state in the NVM device 230, the NVM device 230 is written to the HR state. If the true SRAM data 229T corresponds to the LR state, the NVM device 230 is not written in order to extend a useful life of the memory bit cell circuit 200.

Figure 10:
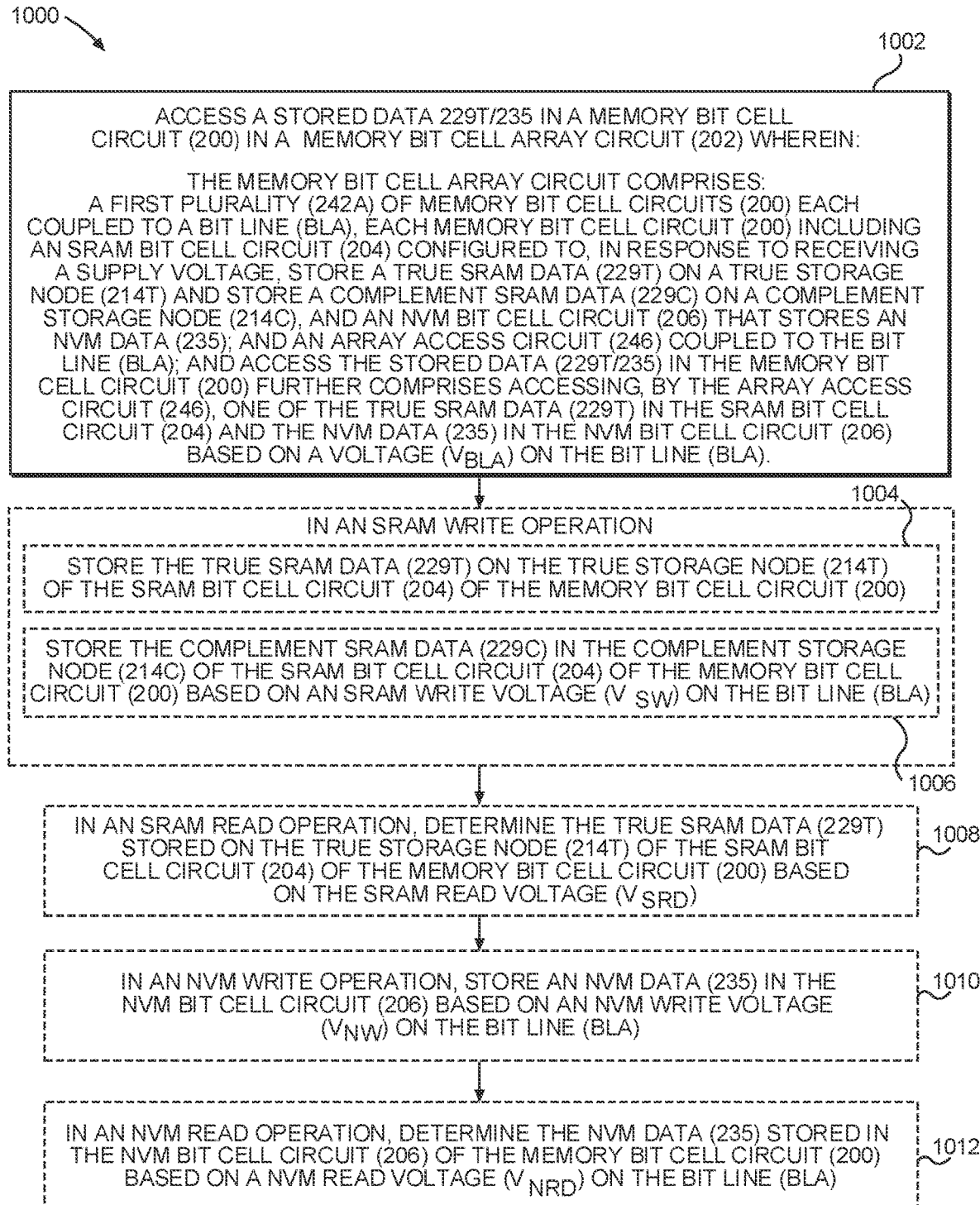
FIGS. 10 is a flowchart illustrating a process of accessing a data in a memory bit cell circuit in the memory bit cell array circuit in FIG. 2.

FIG. 10 is a flowchart of a method 1000 for accessing a stored data, including the true SRAM data 229T or the binary NVM data 235, in a memory bit cell circuit 200 in a memory bit cell array circuit 202 that includes a first plurality 242A of memory bit cell circuits 200 each coupled to a bit line BLA and an array access circuit 246 coupled to the bit line BLA. In the method, each memory bit cell circuit 200 includes an SRAM bit cell circuit 204 that, in response to receiving a supply voltage $V_{DD}$, stores a true SRAM data 229T on a true storage node 214T and stores a complement SRAM data 229C on a complement storage node 214C. Each memory bit cell circuit 200 also includes an NVM bit cell circuit 206 that stores a binary NVM data 235. The method includes accessing, by the array access circuit 246, one of the true SRAM data 229T in the SRAM bit cell circuit 204 and the binary NVM data 235 in the NVM bit cell circuit 206 (block 1002).

In a first example, accessing the stored data in the memory bit cell circuit 200 may further include, in an SRAM write operation, storing the true SRAM data 229T on the true storage node 214T of the SRAM bit cell circuit 204 of the memory bit cell circuit 200 (block 1004) and storing the complement SRAM data 229C in the complement storage node 214C of the SRAM bit cell circuit 204 of the memory bit cell circuit 200 based on an SRAM write voltage $V_{SW}$ on the bit line BLA (block 1006).

In a second option, accessing the stored data in the memory bit cell circuit 200 may further include, in an SRAM read operation, determining the true SRAM data 229T stored on the true storage node 214T of the SRAM bit cell circuit 204 of the memory bit cell circuit 200 based on the SRAM read voltage $V_{SRD}$ (block 1008), In a third example, accessing the stored data in the memory bit cell circuit 200 may further include, in an NVM write operation, storing the binary NVM data 235 in the NVM bit cell circuit 206 based on a NVM write voltage $V_{NW}$ on the bit line BLA (block 1010).

In a fourth example, accessing the stored data in the memory bit cell circuit 200 may further include, in an NVM read operation, determining the binary NVM data 235 stored in the NVM bit cell circuit 206 of the memory bit cell circuit 200 based on a NVM read voltage $V_{NRD}$ on the bit line BLA (block 1012).

Figure 11:
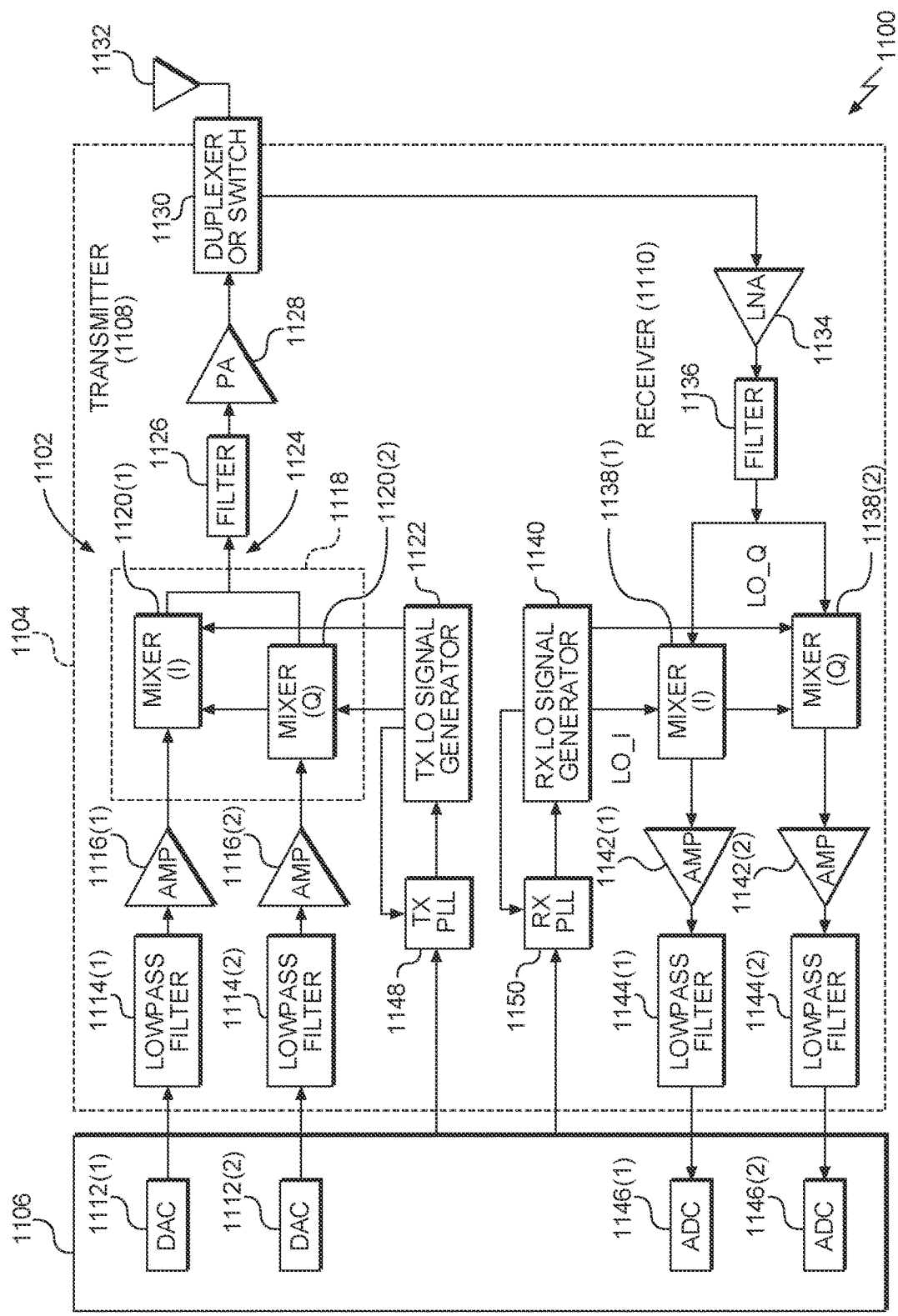
FIG. 11 is a block diagram of an exemplary wireless communications device that includes a radio frequency (RF) module including the memory bit cell array circuit in FIG. 2.

FIG. 11 illustrates an exemplary wireless communications device 1100 that includes radio frequency (RF) components formed from one or more integrated circuits (ICs) 1102, wherein any of the ICs 1102 can include an exemplary memory bit cell circuit, including a bit line coupled to an SRAM bit cell circuit and an NVM bit cell circuit with reduced transistor counts for reduced area and reduced power consumption, included in a memory bit cell array circuit, as illustrated in FIG. 2, and according to any of the aspects disclosed herein. The wireless communications device 1100 may include or be provided in any of the above-referenced devices, as examples. As shown in FIG. 11, the wireless communications device 1100 includes a transceiver 1104 and a data processor 1106. The data processor 1106 may include a memory to store data and program codes. The transceiver 1104 includes a transmitter 1108 and a receiver 1110 that support bi-directional communications. In general, the wireless communications device 1100 may include any number of transmitters 1108 and/or receivers 1110 for any number of communication systems and frequency bands. All or a portion of the transceiver 1104 may be implemented on one or more analog ICs, RF ICs, mixed-signal ICs, etc.

The transmitter 1108 or the receiver 1110 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage and then from IF to baseband in another stage. In the direct-conversion architecture, a signal is frequency-converted between RF and baseband in one stage. The super-heterodyne and direct-conversion architectures may use different circuit blocks and/or have different requirements. In the wireless communications device 1100 in FIG. 11, the transmitter 1108 and the receiver 1110 are implemented with the direct-conversion architecture.

In the transmit path, the data processor 1106 processes data to be transmitted and provides I and Q analog output signals to the transmitter 1108. In the exemplary wireless communications device 1100, the data processor 1106 includes digital-to-analog converters (DACs) 1112(1), 1112(2) for converting digital signals generated by the data processor 1106 into the I and Q analog output signals, e.g., I and Q output currents, for further processing.

Within the transmitter 1108, lowpass filters 1114(1), 1114(2) filter the I and Q analog output signals, respectively, to remove undesired signals caused by the prior digital-to-analog conversion. Amplifiers (AMPS) 1116(1), 1116(2) amplify the signals from the lowpass filters 1114(1), 1114(2), respectively, and provide I and Q baseband signals. An upconverter 1118 upconverts the I and Q baseband signals with I and Q transmit (TX) local oscillator (LO) signals from a TX LO signal generator 1122 through mixers 1120(1), 1120(2) to provide an upconverted signal 1124. A filter 1126 filters the upconverted signal 1124 to remove undesired signals caused by the frequency upconversion as well as noise in a receive frequency band. A power amplifier (PA) 1128 amplifies the upconverted signal 1124 from the filter 1126 to obtain the desired output power level and provides a transmit RF signal. The transmit RF signal is routed through a duplexer or switch 1130 and transmitted via an antenna 1132.

In the receive path, the antenna 1132 receives signals transmitted by base stations and provides a received RF signal, which is routed through the duplexer or switch 1130 and provided to a low noise amplifier (LNA) 1134. The duplexer or switch 1130 is designed to operate with a specific receive (RX)-to-TX duplexer frequency separation, such that RX signals are isolated from TX signals. The received RF signal is amplified by the LNA 1134 and filtered by a filter 1136 to obtain a desired RF input signal. Down-conversion mixers 1138(1), 1138(2) mix the output of the filter 1136 with I and Q RX LO signals (i.e., LO_I and LO_Q) from an RX LO signal generator 1140 to generate I and Q baseband signals. The I and Q baseband signals are amplified by AMPs 1142(1), 1142(2) and further filtered by lowpass filters 1144(1), 1144(2) to obtain I and Q analog input signals, which are provided to the data processor 1106. In this example, the data processor 1106 includes analog-to-digital converters (ADCs) 1146(1), 1146(2) for converting the analog input signals into digital signals to be further processed by the data processor 1106.

In the wireless communications device 1100 of FIG. 11, the TX LO signal generator 1122 generates the I and Q TX LO signals used for frequency upconversion, while the RX LO signal generator 1140 generates the I and Q RX LO signals used for frequency downconversion. Each LO signal is a periodic signal with a particular fundamental frequency. A TX phase-locked loop (PLL) circuit 1148 receives timing information from the data processor 1106 and generates a control signal used to adjust the frequency and/or phase of the TX LO signals from the TX LO signal generator 1122. Similarly, an RX PLL circuit 1150 receives timing information from the data processor 1106 and generates a control signal used to adjust the frequency and/or phase of the RX LO signals from the RX LO signal generator 1140.

Wireless communications devices 1100 that each include an exemplary memory bit cell circuit, including a bit line coupled to an SRAM bit cell circuit and an NVM bit cell circuit with reduced transistor counts for reduced area and power consumption, included in a memory bit cell array circuit, as illustrated in FIG. 2, and according to any of the aspects disclosed herein, may be provided in or integrated into any processor-based device. Examples, without limitation, include a set-top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, and a commercial drone.

Figure 12:
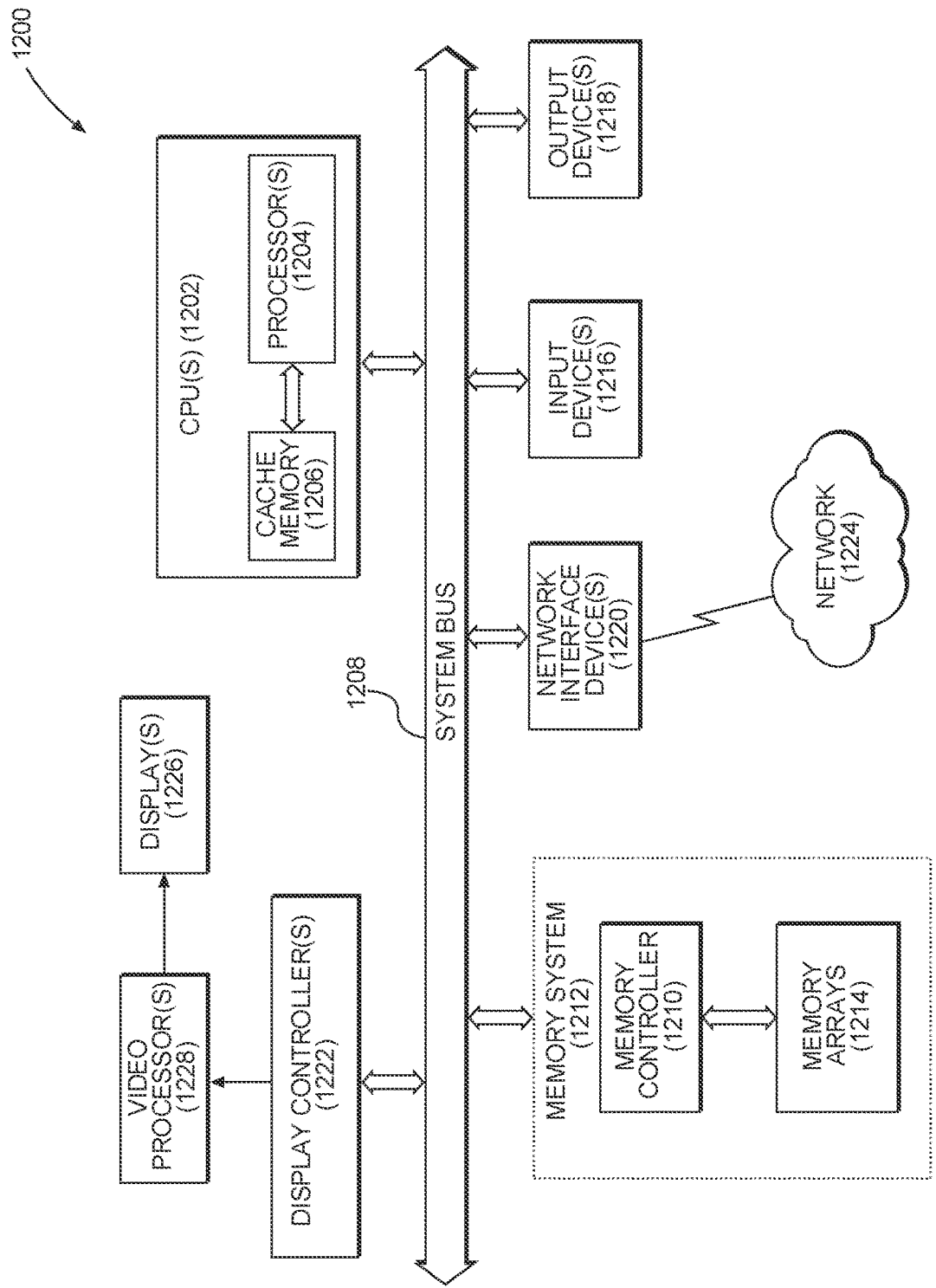
FIG. 12 is a block diagram of an exemplary memory bit cell array circuit, including a memory bit cell circuit having a reduced device count and a single bit line for accessing both a SRAM bit cell circuit and a NVM bit cell circuit for reduced area and reduced power consumption, as illustrated in FIG. 2, and according to any of the aspects disclosed herein.

In this regard, FIG. 12 illustrates an example of a processor-based system 1200 including an exemplary memory bit cell circuit, including a bit line coupled to an SRAM bit cell circuit and an NVM bit cell circuit with reduced transistor counts for reduced area and reduced power consumption, included in a memory bit cell array circuit, as illustrated in FIG. 2, and according to any aspects disclosed herein. In this example, the processor-based system 1200 includes one or more central processor units (CPUs) 1202, which may also be referred to as CPU or processor cores, each including one or more processors 1204. The CPU(s) 1202 may have cache memory 1206 coupled to the processor(s) 1204 for rapid access to temporarily stored data. As an example, the processor(s) 1204 could include an exemplary memory hit cell circuit, including a bit line coupled to an SRAM bit cell circuit and an NVM bit cell circuit with reduced transistor counts for reduced area and reduced power consumption, included in a memory bit cell array circuit, as illustrated in FIG. 2, and according to any aspects disclosed herein. The CPU(s) 1202 is coupled to a system bus 1208 and can intercouple master and slave devices included in the processor-based system 1200. As is well known, the CPU(s) 1202 communicates with these other devices by exchanging address, control, and data information over the system bus 1208. For example, the CPU(s) 1202 can communicate bus transaction requests to a memory controller 1210 as an example of a slave device. Although not illustrated in FIG. 12, multiple system buses 1208 could be provided, wherein each system bus 1208 constitutes a different fabric.

Other master and slave devices can be connected to the system bus 1208. As illustrated in FIG. 12, these devices can include a memory system 1212 that includes the memory controller 1210 and one or more memory arrays 1214, one or more input devices 1216, one or more output devices 1218, one or more network interface devices 1220, and one or more display controllers 1222, as examples. Each of the memory system 1212, the one or more input devices 1216, the one or more output devices 1218, the one or more network interface devices 1220, and the one or more display controllers 1222 can include an exemplary memory hit cell circuit, including a bit line coupled to an SRAM bit cell circuit and an NVM bit cell circuit with reduced transistor counts for reduced area and reduced power consumption, included in a memory bit cell array circuit, as illustrated in FIG. 2, and according to any of the aspects disclosed herein. The input device(s) 1216 can include any type of input device, including, but not limited to, input keys, switches, voice processors, etc. The output device(s) 1218 can include any type of output device, including, but not limited to, audio, video, other visual indicators, etc. The network interface device(s) 1220 can be any device configured to allow exchange of data to and from a network 1224. The network 1224 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1220 can be configured to support any type of communications protocol desired.

The CPU(s) 1202 may also be configured to access the display controller(s) 1222 over the system bus 1208 to control information sent to one or more displays 1226. The display controller(s) 1222 sends information to the display(s) 1226 to be displayed. via one or more video processors 1228, which process the information to be displayed into a format suitable for the display(s) 1226. The display(s) 1226 can include any type of display, including, but not limited to, a cathode ray tube (CRT), a liquid crystal display (LCD), a plasma display, a light-emitting diode (LED) display, etc. The display controller(s) 1222 display(s) 1226, and/or the video processor(s) 1228 can include an exemplary memory hit cell circuit, including a bit line coupled to an SRAM bit cell circuit and an NVM bit cell circuit with reduced transistor counts for reduced area and reduced power consumption, included in a memory bit cell array circuit, as illustrated in FIG. 2, and according to any of the aspects disclosed herein.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware and may reside, for example, in Random Access Memory (RAM), flash memory, Read-Only Memory (ROM), Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

Implementation examples are described in the following numbered clauses:

1. A memory bit cell circuit, comprising:
   a bit line;
   a static random-access memory (SRAM) bit cell circuit, comprising:
      a storage circuit, comprising:
         a true inverter circuit comprising:
            a true input node;
            a true output node comprising a true storage node;
            a true power node coupled to a supply voltage rail; and
            a true ground node coupled to a ground voltage rail; and
         a complement inverter circuit comprising:
            a complement input node coupled to the true output node of the true inverter circuit;
            a complement output node comprising a complement storage node coupled to the true input node of the true inverter circuit;
            a complement power node coupled to a high voltage rail; and
            a complement ground node coupled to a low voltage rail; and
      a first access circuit coupled to the true output node and the bit line; and
   a non-volatile memory (NVM) bit cell circuit comprising:
      a NVM device coupled between the complement output node and a first node; and
      a second access circuit coupled to the first node and the bit line.

2. The memory bit cell circuit of clause 1, wherein the SRAM bit cell circuit is configured to, in response to the first access circuit coupling the bit line to the true output node and an SRAM write voltage being supplied to the bit line, store a true SRAM data on the true output node and store a complement SRAM data on the complement output node.

3. The memory bit cell circuit of clause 1 or 2, wherein the NVM device is a magnetic random-access memory (MRAM) device configured to, in response to the second access circuit coupling the first node to the bit line, store a first binary NVM data based on conducting a first current in a first direction between the bit line and the complement storage node or conducting a second current in a second direction between the bit line and the complement storage node.

4. The memory bit cell circuit of clause 3, wherein:
   the supply voltage rail is configured to receive a supply voltage;
   the ground voltage rail is configured to receive a ground voltage;
   the high voltage rail is configured to receive a higher voltage than the supply voltage;
   the low voltage rail is configured to receive a lower voltage than the ground voltage; and
   in response to the second access circuit coupling the first node to the bit line, the complement inverter circuit is configured to conduct one of the first current in the first direction and the second current in the second direction through the NVM device.

5. A memory bit cell array circuit, comprising:
   a first bit line;
   a first plurality of memory bit cell circuits each coupled to the first bit line, each memory bit cell circuit comprising:
      a static random-access memory (SRAM) hit cell circuit configured to, in response to receiving a supply voltage, store a true SRAM data on a true storage node and store a complement SRAM data on a complement storage node, the SRAM bit cell circuit comprising a first access circuit coupled to the true storage node and the first bit line; and
      a non-volatile memory (NVM) bit cell circuit configured to store an NVM data, the NVM bit cell circuit comprising:
         an NVM device coupled to the complement storage node of the SRAM hit cell circuit and a first node; and
         a second access circuit coupled to the first node and the first bit line; and an array access circuit coupled to the first bit line, the array access circuit configured to:
  determine the true SRAM data stored in the SRAM bit cell circuit of a memory bit cell circuit of the first plurality of memory bit cell circuits based on a first SRAM read voltage on the first bit line; and
  determine a first NVM data stored in the NVM bit cell circuit of the memory bit cell circuit of the first plurality of memory bit cell circuits based on a first NVM read voltage on the first bit line.

6. The memory bit cell array circuit of clause 5, the array access circuit further comprising a sense amplifier circuit coupled to the first bit line, wherein:
  the sense amplifier circuit is configured to compare the first SRAM read voltage on the first bit line to an SRAM reference voltage, the SRAM reference voltage being a voltage between the supply voltage and a ground voltage; and
  the sense amplifier circuit is further configured to compare the first NVM read voltage on the first bit line to an NVM reference voltage.

7. The memory bit cell array circuit of clause 6, wherein:
  the NVM device is configured to comprise a high resistance state in response to a first current and a low resistance state in response to a second current; and
  the memory bit cell circuit further comprises an NVM reference circuit configured to supply the NVM reference voltage, the NVM reference circuit coupled to a second bit line and comprising:
    a first high resistance (HR) NVM device coupled to the second bit line and a ground voltage node and configured to comprise the high resistance state; and
    a first low resistance (LR) NVM device coupled between the second bit line and the ground voltage node and configured to comprise the low resistance state.

8. The memory bit cell array circuit of clause 7, the array access circuit further comprising:
  the sense amplifier circuit comprising a first input and a second input;
  a clamp circuit configured to, in response to a read operation of the NVM hit cell circuit in the memory bit cell circuit of the first plurality of memory bit cell circuits, couple the first hit line to the first input of the sense amplifier circuit and couple the second bit line to the second input of the sense amplifier circuit; and
  a half $V_{DD}$ pre-charge (HVP) circuit configured to, in response to a read operation of the SRAM bit cell circuit in the memory bit cell circuit of the first plurality of memory hit cell circuits, couple the first bit line to the first input of the sense amplifier circuit and couple the SRAM reference voltage to the second input of the sense amplifier circuit.

9. The memory bit cell array circuit of clause 8, further comprising:
  a second plurality of memory hit cell circuits coupled to the second bit line; and
  a second NVM reference circuit configured to supply the NVM reference voltage on the first bit line;
  wherein the array access circuit is further configured to determine a second NVM data stored in one of the second plurality of memory hit cell circuits.

10. The memory bit cell array circuit of clause 9, wherein: the second NVM reference circuit comprises:
  a second HR NVM device coupled to the first bit line and the ground voltage node, the second HR NVM device configured to comprise the high resistance state; and
  a second LR NVM device coupled to the first bit line and the ground voltage node, the second LR NVM device configured to comprise the low resistance state.

11. The memory bit cell array circuit of clause 9 or 10, wherein the array access circuit configured to determine a second true SRAM data stored in one of the second plurality of memory bit cell circuits is further configured to compare a second SRAM read voltage on the second input of the sense amplifier circuit to the SRAM reference voltage on the first input of the sense amplifier circuit.

12. The memory bit cell array circuit of any one of clauses 9 to 11, the array access circuit further comprising:
  a first write driver coupled to the first bit line; and
  a second write driver coupled to the second bit line;
  wherein:
    the first write driver is configured to write a first true SRAM data into the SRAM bit cell circuit of the memory bit cell circuit of the first plurality of memory bit cell circuits; and
    the second write driver is configured to write a second true SRAM data into an SRAM bit cell circuit of the one of the second plurality of memory bit cell circuits.

13. The memory bit cell array circuit any one of clauses 5 to 12 integrated into a radio-frequency (RE) front end module.

14. The memory bit cell array circuit of any one of clauses 5 to 12 integrated into a device selected from the group consisting of: a set-top box; an entertainment unit; a navigation device; a communications device; a fixed location data unit; a mobile location data unit; a global positioning system (GPS) device; a mobile phone; a cellular phone; a smartphone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; and a commercial drone.

15. A method of accessing stored data in a memory bit cell circuit in a memory bit cell array circuit, comprising:
  accessing, by an array access circuit, one of a true static random-access memory (SRAM) data in an SRAM bit cell circuit and a non-volatile memory (NVM) data in an NVM bit cell circuit based on a voltage on a first hit line.

16. The method of clause 15, wherein the memory bit cell array circuit comprises:
  a first plurality of memory bit cell circuits each coupled to the first bit line, each memory bit cell circuit comprising:
    an SRAM bit cell circuit configured to, in response to receiving a supply voltage, store a true SRAM data on a true storage node and store a complement SRAM data on a complement storage node; and
    an NVM bit cell circuit configured to store an NVM data; and
  the array access circuit coupled to the first hit line.

17. The method of clause 16, wherein accessing the one of the true SRAM data in the SRAM bit cell circuit and the NVM data in the NVM bit cell circuit, further comprises, in an SRAM write operation, storing the true SRAM data on the true storage node of the SRAM bit cell circuit of the memory bit cell circuit and storing the complement SRAM data on the complement storage node of the SRAM bit cell circuit of the memory bit cell circuit based on a SRAM write data voltage on the first bit line.

18. The method of clause 17, wherein:
the array access circuit further comprises a first write driver coupled to the first bit line; and
storing the true SRAM data on the true storage node of the SRAM bit cell circuit of the memory bit cell circuit further comprises supplying, by the first write driver, the SRAM write data voltage to the first hit line.

19. The method of any one of clauses 16 to 18, wherein accessing the stored data in the memory bit cell circuit further comprises, in an SRAM read operation, determining the true SRAM data stored on the true storage node of the SRAM bit cell circuit of the memory bit cell circuit based on a first SRAM read voltage on the first hit line, 20. The method of clause 19, wherein:
the array access circuit further comprises:
  a sense amplifier circuit comprising a first input and a second input; and
  a half $V_{DD}$ pre-charge (HVP) circuit coupling the first bit line to the first input of the sense amplifier circuit and supplying an SRAM reference voltage to the second input of the sense amplifier circuit; and
determining the true SRAM data stored on the true storage node of the SRAM bit cell circuit of the memory bit cell circuit further comprises:
  pre-charging, by the HVP circuit, the first bit line to half of the supply voltage;
  activating a first access circuit to couple the true storage node of the SRAM bit cell circuit to the first bit line to supply the first SRAM read voltage corresponding to the true SRAM data to the first bit line; and
  comparing, by the sense amplifier circuit, the first SRAM read voltage on the first input of the sense amplifier circuit to the SRAM reference voltage on the second input of the sense amplifier circuit.

21. The method of any one of clauses 16 to 20, wherein in an NVM write operation, accessing the one of the true SRAM data in the SRAM bit cell circuit and the NVM data in the NVM hit cell circuit further comprises storing the NVM data in the NVM hit cell circuit of the memory bit cell circuit based on a first NVM write voltage on the first bit line.

22. The method of clause 21, wherein:
the array access circuit further comprises a first write driver coupled to the first bit line;
the SRAM bit cell circuit further comprises a true inverter circuit cross-coupled with a complement inverter circuit comprising the complement storage node;
the NVM bit cell circuit further comprises:
  an NVM device coupled to the complement storage node of the SRAM bit cell circuit and a first node; and
  a second access circuit coupled to the first node and to the first bit line; and
storing the NVM data in the NVM bit cell circuit further comprises:
  supplying the supply voltage and a ground voltage to the true inverter circuit;
  supplying a higher voltage higher than the supply voltage and a lower voltage lower than the ground voltage to the complement inverter circuit;
  supplying, by the first mite driver, the first NVM write voltage to the first bit line; and
  activating the second access circuit to couple the first bit line to the node.

23. The method of clause 22, wherein storing the NVM data in the NVM bit cell circuit further comprises storing the complement SRAM data corresponding to the NVM data on the complement storage node of the SRAM bit cell circuit.

24. The method of any one of clauses 16 to 23, wherein accessing the one of the true SRAM data in the SRAM bit cell circuit and the NVM data in the NVM bit cell circuit further comprises, in response to an NVM read operation, determining the NVM data stored in the NVM bit cell circuit of the memory bit cell circuit based on a first NVM read voltage on the first bit line.

25. The method of clause 24, wherein determining the NVM data stored in the NVM bit cell circuit further comprises comparing the first NVM read voltage on the first bit line to a first reference voltage.

26. The method of any one of clauses 16 to 25, wherein:
the memory bit cell array circuit further comprises:
  a second bit line coupled to the array access circuit; and
  a NVM reference circuit coupled to the second bit line, the NVM reference circuit configured to supply an NVM reference voltage;
the NVM bit cell circuit further comprises:
  an NVM device coupled to the complement storage node of the SRAM bit cell circuit and a first node; and
  an access circuit coupled to the first node and to the first bit line;
the array access circuit further comprises:
  a sense amplifier circuit comprising a first input and a second input; and
  a clamp circuit coupled to the first bit line, the second bit line, the first input of the sense amplifier circuit, and the second input of the sense amplifier circuit; and
determining the NVM data stored in the NVM bit cell circuit comprises:
  supplying, by the clamp circuit, an intermediate voltage less than the supply voltage to the first bit line;
  supplying, by the clamp circuit, the intermediate voltage on the second bit line to the NVM reference circuit to generate the NVM reference voltage;
  activating the access circuit to couple the NVM device to the first bit line to supply a first NVM read voltage based on the NVM data to the first bit line;
  coupling, by the clamp circuit, the first bit line to the first input of the sense amplifier circuit and the second bit line to the second input of the sense amplifier circuit; and
  comparing, by the sense amplifier circuit, the first NVM read voltage on the first input to the NVM reference voltage on the second input.

27. A method of operating a memory bit cell array circuit, comprising:
in response to activating a supply voltage in a static random-access memory (SRAM) bit cell circuit, driving a first current through a non-volatile memory (NVM) bit cell circuit of each memory bit cell circuit in a first plurality of memory bit cell circuits to set the NVM bit cell circuit to a first resistance state; and
in response to an indication of deactivation of the supply voltage:
  for each memory bit cell circuit of the first plurality of memory bit cell circuits:
    reading a true SRAM data on a true storage node of the SRAM bit cell circuit;
    in response to determining the true SRAM data in the SRAM bit cell circuit corresponds to a second resistance state of the NVM bit cell circuit, driving a second current through the NVM bit cell circuit to set the NVM bit cell circuit to the second resistance state; and
    in response to determining the true SRAM data in the SRAM bit cell circuit corresponds to the first resistance state of the NVM bit cell circuit, leaving the NVM bit cell circuit in the first resistance state, wherein in the first plurality of memory bit cell circuits, each memory bit cell circuit comprises:
the SRAM bit cell circuit configured to, in response to receiving the supply voltage, store the true SRAM data on the true storage node and store a complement SRAM data on a complement storage node; and
the NVM bit cell circuit configured to store an NVM data independent of the SRAM bit cell circuit receiving the supply voltage.

What is claimed is:

1. A memory bit cell circuit, comprising:
a bit line;
a static random-access memory (SRAM) bit cell circuit, comprising:
  a storage circuit, comprising:
    a true inverter circuit comprising:
      a true input node;
      a true output node comprising a true storage node;
      a true power node coupled to a supply voltage rail; and
      a true ground node coupled to a ground voltage rail; and
    a complement inverter circuit comprising:
      a complement input node coupled to the true output node of the true inverter circuit;
      a complement output node comprising a complement storage node coupled to the true input node of the true inverter circuit;
      a complement power node coupled to a high voltage rail; and
      a complement ground node coupled to a low voltage rail; and
  a first access circuit coupled to the true output node and the bit line; and
a non-volatile memory (NVM) bit cell circuit comprising:
  a NVM device coupled between the complement output node and a first node; and
  a second access circuit coupled to the first node and the bit line,
wherein the NVM device is a magnetic random-access memory (MRAM) device configured to, in response to the second access circuit coupling the first node to the bit line, store a first binary NVM data based on conducting a first current in a first direction between the bit line and the complement storage node or conducting a second current in a second direction between the bit line and the complement storage node and wherein the supply voltage rail is configured to receive a supply voltage, the ground voltage rail is configured to receive a ground voltage, the high voltage rail is configured to receive a higher voltage than the supply voltage, the low voltage rail is configured to receive a lower voltage than the ground voltage, and in response to the second access circuit coupling the first node to the bit line, the complement inverter circuit is configured to conduct one of the first current in the first direction and the second current in the second direction through the NVM device.

2. The memory bit cell circuit of claim 1, wherein the SRAM bit cell circuit is configured to, in response to the first access circuit coupling the bit line to the true output node and an SRAM write voltage being supplied to the bit line, store a true SRAM data on the true output node and store a complement SRAM data on the complement output node.

3. A memory bit cell array circuit, comprising:
a first bit line;
a first plurality of memory bit cell circuits each coupled to the first bit line, each memory bit cell circuit comprising:
  a static random-access memory (SRAM) bit cell circuit configured to, in response to receiving a supply voltage, store a true SRAM data on a true storage node and store a complement SRAM data on a complement storage node, the SRAM bit cell circuit comprising a first access circuit coupled to the true storage node and the first bit line, the SRAM bit cell circuit further comprising a true power node to receive the supply voltage, a true ground node to receive a ground voltage, a complement power node to receive a higher voltage than the supply voltage, and a complement ground node to receive a lower voltage than the ground voltage; and
  a non-volatile memory (NVM) bit cell circuit configured to store an NVM data, the NVM bit cell circuit comprising:
    an NVM device coupled to the complement storage node of the SRAM bit cell circuit and a first node; and
    a second access circuit coupled to the first node and the first bit line,
  wherein the NVM device is a magnetic random-access memory (MRAM) device configured to, in response to the second access circuit coupling the first node to the first bit line, store a first binary NVM data based on conducting a first current in a first direction between the first bit line and the complement storage node or conducting a second current in a second direction between the first bit line and the complement storage node and wherein in response to the second access circuit coupling the first node to the first bit line, a complement inverter circuit of the SRAM bit cell circuit is configured to conduct one of the first current in the first direction and the second current in the second direction through the NVM device; and
an array access circuit coupled to the first bit line, the array access circuit configured to:
  determine the true SRAM data stored in the SRAM bit cell circuit of a memory bit cell circuit of the first plurality of memory bit cell circuits based on a first SRAM read voltage on the first bit line; and
  determine a first NVM data stored in the NVM bit cell circuit of the memory bit cell circuit of the first plurality of memory bit cell circuits based on a first NVM read voltage on the first bit line.

4. The memory bit cell array circuit of claim 3, the array access circuit further comprising a sense amplifier circuit coupled to the first bit line, wherein:
the sense amplifier circuit is configured to compare the first SRAM read voltage on the first bit line to an SRAM reference voltage, the SRAM reference voltage being a voltage between the supply voltage and the ground voltage; and
the sense amplifier circuit is further configured to compare the first NVM read voltage on the first bit line to an NVM reference voltage.

5. The memory bit cell array circuit of claim 4, wherein:
the NVM device is configured to comprise a high resistance state in response to the first current and a low resistance state in response to the second current; and the memory bit cell array circuit further comprises an NVM reference circuit configured to supply the NVM reference voltage, the NVM reference circuit coupled to a second bit line and comprising:
  a first high resistance (HR) NVM device coupled to the second bit line and a ground voltage node and configured to comprise the high resistance state; and
  a first low resistance (LR) NVM device coupled between the second bit line and the ground voltage node and configured to comprise the low resistance state.

6. The memory bit cell array circuit of claim 5, the array access circuit further comprising:
  the sense amplifier circuit comprising a first input and a second input;
  a clamp circuit configured to, in response to a read operation of the NVM bit cell circuit in the memory bit cell circuit of the first plurality of memory bit cell circuits, couple the first bit line to the first input of the sense amplifier circuit and couple the second bit line to the second input of the sense amplifier circuit; and
  a half $V_{DD}$ pre-charge (HVP) circuit configured to, in response to a read operation of the SRAM bit cell circuit in the memory bit cell circuit of the first plurality of memory bit cell circuits, couple the first bit line to the first input of the sense amplifier circuit and couple the SRAM reference voltage to the second input of the sense amplifier circuit.

7. The memory bit cell array circuit of claim 6, further comprising:
  a second plurality of memory bit cell circuits coupled to the second bit line; and
  a second NVM reference circuit configured to supply the NVM reference voltage on the first bit line;
  wherein the array access circuit is further configured to determine a second NVM data stored in one of the second plurality of memory bit cell circuits.

8. The memory bit cell array circuit of claim 7, wherein: the second NVM reference circuit comprises:
  a second HR NVM device coupled to the first bit line and the ground voltage node, the second HR NVM device configured to comprise the high resistance state; and
  a second LR NVM device coupled to the first bit line and the ground voltage node, the second LR NVM device configured to comprise the low resistance state.

9. The memory bit cell array circuit of claim 7, wherein the array access circuit configured to determine a second true SRAM data stored in one of the second plurality of memory bit cell circuits is further configured to compare a second SRAM read voltage on the second input of the sense amplifier circuit to the SRAM reference voltage on the first input of the sense amplifier circuit.

10. The memory bit cell array circuit of claim 7, the array access circuit further comprising:
  a first write driver coupled to the first bit line; and
  a second write driver coupled to the second bit line;
  wherein:
    the first write driver is configured to write a first true SRAM data into the SRAM bit cell circuit of the memory bit cell circuit of the first plurality of memory bit cell circuits; and
    the second write driver is configured to write a second true SRAM data into an SRAM bit cell circuit of the one of the second plurality of memory bit cell circuits.

11. The memory bit cell array circuit of claim 3 integrated into a device selected from the group consisting of: a set-top box; an entertainment unit; a navigation device; a communications device; a fixed location data unit; a mobile location data unit; a global positioning system (GPS) device; a mobile phone; a cellular phone; a smartphone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; and a commercial drone.

12. A method of accessing stored data in a memory bit cell circuit in a memory bit cell array circuit, comprising:
  accessing, by an array access circuit, one of a true static random-access memory (SRAM) data in an SRAM bit cell circuit and a non-volatile memory (NVM) data in an NVM bit cell circuit based on a voltage on a first bit line,
  wherein the memory bit cell array circuit comprises:
    a first plurality of memory bit cell circuits each coupled to the first bit line, each memory bit cell circuit comprising:
      an SRAM bit cell circuit configured to, in response to receiving a supply voltage, store a true SRAM data on a true storage node and store a complement SRAM data on a complement storage node; and
      an NVM bit cell circuit configured to store an NVM data,
  wherein in an NVM write operation, accessing the one of the true SRAM data in the SRAM bit cell circuit and the NVM data in the NVM bit cell circuit further comprises storing the NVM data in the NVM bit cell circuit of the memory bit cell circuit based on a first NVM write voltage on the first bit line, and
  wherein the array access circuit further comprises a first write driver coupled to the first bit line, the SRAM bit cell circuit further comprises a true inverter circuit cross-coupled with a complement inverter circuit comprising the complement storage node, the NVM bit cell circuit further comprises: an NVM device coupled to the complement storage node of the SRAM bit cell circuit and a first node, and a second access circuit coupled to the first node and the first bit line, and storing the NVM data in the NVM bit cell circuit further comprises: supplying the supply voltage and a ground voltage to the true inverter circuit, supplying a higher voltage higher than the supply voltage and a lower voltage lower than the ground voltage to the complement inverter circuit, supplying, by the first write driver, the first NVM write voltage to the first bit line, and activating the second access circuit to couple the first bit line to the first node.

13. The method of claim 12, wherein accessing the one of the true SRAM data in the SRAM bit cell circuit and the NVM data in the NVM bit cell circuit further comprises, in an SRAM write operation, storing the true SRAM data on the true storage node of the SRAM bit cell circuit of the memory bit cell circuit and storing the complement SRAM data on the complement storage node of the SRAM bit cell circuit of the memory bit cell circuit based on a SRAM write data voltage on the first bit line.

14. The method of claim 13, wherein:
storing the true SRAM data on the true storage node of the SRAM bit cell circuit of the memory bit cell circuit further comprises supplying, by the first write driver, the SRAM write data voltage to the first bit line.

15. The method of claim 12, wherein accessing the stored data in the memory bit cell circuit further comprises, in an SRAM read operation, determining the true SRAM data stored on the true storage node of the SRAM bit cell circuit of the memory bit cell circuit based on a first SRAM read voltage on the first bit line.

16. The method of claim 15, wherein:
the array access circuit further comprises:
a sense amplifier circuit comprising a first input and a second input; and
a half $V_{DD}$ pre-charge (HVP) circuit coupling the first bit line to the first input of the sense amplifier circuit and supplying an SRAM reference voltage to the second input of the sense amplifier circuit; and
determining the true SRAM data stored on the true storage node of the SRAM bit cell circuit of the memory bit cell circuit further comprises:
pre-charging, by the HVP circuit, the first bit line to half of the supply voltage;
activating a first access circuit to couple the true storage node of the SRAM bit cell circuit to the first bit line to supply the first SRAM read voltage corresponding to the true SRAM data to the first bit line; and
comparing, by the sense amplifier circuit, the first SRAM read voltage on the first input of the sense amplifier circuit to the SRAM reference voltage on the second input of the sense amplifier circuit.

17. The method of claim 12, wherein storing the NVM data in the NVM bit cell circuit further comprises storing the complement SRAM data corresponding to the NVM data on the complement storage node of the SRAM bit cell circuit.

18. The method of claim 12, wherein accessing the one of the true SRAM data in the SRAM bit cell circuit and the NVM data in the NVM bit cell circuit further comprises, in response to an NVM read operation, determining the NVM data stored in the NVM bit cell circuit of the memory bit cell circuit based on a first NVM read voltage on the first bit line.

19. The method of claim 18, wherein determining the NVM data stored in the NVM bit cell circuit further comprises comparing the first NVM read voltage on the first bit line to a first reference voltage.

20. The method of claim 12, wherein:
the memory bit cell array circuit further comprises:
a second bit line coupled to the array access circuit; and
a NVM reference circuit coupled to the second bit line, the NVM reference circuit configured to supply an NVM reference voltage;
the array access circuit further comprises:
a sense amplifier circuit comprising a first input and a second input; and
a clamp circuit coupled to the first bit line, the second bit line, the first input of the sense amplifier circuit, and the second input of the sense amplifier circuit; and
determining the NVM data stored in the NVM bit cell circuit comprises:
supplying, by the clamp circuit, an intermediate voltage less than the supply voltage to the first bit line;
supplying, by the clamp circuit, the intermediate voltage on the second bit line to the NVM reference circuit to generate the NVM reference voltage;
activating the second access circuit to couple the NVM device to the first bit line to supply a first NVM read voltage based on the NVM data to the first bit line;
coupling, by the clamp circuit, the first bit line to the first input of the sense amplifier circuit and the second bit line to the second input of the sense amplifier circuit; and
comparing, by the sense amplifier circuit, the first NVM read voltage on the first input to the NVM reference voltage on the second input.

21. A method of operating a memory bit cell array circuit, comprising:
in response to activating a supply voltage in a static random-access memory (SRAM) bit cell circuit, driving a first current through a non-volatile memory (NVM) bit cell circuit of each memory bit cell circuit in a first plurality of memory bit cell circuits to set the NVM bit cell circuit to a first resistance state; and
in response to an indication of deactivation of the supply voltage:
for each memory bit cell circuit of the first plurality of memory bit cell circuits:
reading a true SRAM data on a true storage node of the SRAM bit cell circuit;
in response to determining the true SRAM data in the SRAM bit cell circuit corresponds to a second resistance state of the NVM bit cell circuit, driving a second current through the NVM bit cell circuit to set the NVM bit cell circuit to the second resistance state; and
in response to determining the true SRAM data in the SRAM bit cell circuit corresponds to the first resistance state of the NVM bit cell circuit, leaving the NVM bit cell circuit in the first resistance state,
wherein in the first plurality of memory bit cell circuits, each memory bit cell circuit comprises:
the SRAM bit cell circuit configured to, in response to receiving the supply voltage, store the true SRAM data on the true storage node and store a complement SRAM data on a complement storage node, the SRAM bit cell circuit comprising a first access circuit coupled to the true storage node and a first bit line, the SRAM bit cell circuit further comprising a true power node to receive the supply voltage, a true ground node to receive a ground voltage, a complement power node to receive a higher voltage than the supply voltage, and a complement ground node to receive a lower voltage than the ground voltage; and
the NVM bit cell circuit configured to store an NVM data independent of the SRAM bit cell circuit receiving the supply voltage.

* * * * *